(12) United States Patent
Ouderkirk

(10) Patent No.: US 9,559,272 B2
(45) Date of Patent: Jan. 31, 2017

(54) EFFICIENT LIGHTING SYSTEM WITH WIDE COLOR RANGE

(71) Applicant: 3M INNOVATIVE PROPERTIES COMPANY, St. Paul, MN (US)

(72) Inventor: Andrew J. Ouderkirk, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 121 days.

(21) Appl. No.: 14/422,778

(22) PCT Filed: May 2, 2013

(86) PCT No.: PCT/US2013/039281
§ 371 (c)(1),
(2) Date: Feb. 20, 2015

(87) PCT Pub. No.: WO2014/042706
PCT Pub. Date: Mar. 20, 2014

(65) Prior Publication Data
US 2015/0228868 A1    Aug. 13, 2015

Related U.S. Application Data

(60) Provisional application No. 61/700,692, filed on Sep. 13, 2012.

(51) Int. Cl.
*F21V 9/16*      (2006.01)
*H01L 33/50*    (2010.01)
(Continued)

(52) U.S. Cl.
CPC ............... *H01L 33/507* (2013.01); *F21K 9/64* (2016.08); *F21V 3/04* (2013.01); *F21V 7/04* (2013.01);
(Continued)

(58) Field of Classification Search
CPC .......... H01L 25/0753; F21K 9/62; F21K 9/64; F21Y 2115/10; F21V 9/16
See application file for complete search history.

(56) References Cited

U.S. PATENT DOCUMENTS

| 5,882,774 A | 3/1999 | Jonza |
| 6,783,349 B2 | 8/2004 | Neavin |

(Continued)

FOREIGN PATENT DOCUMENTS

| EP | 2402415 | 1/2012 |
| JP | 2007-227679 | 9/2007 |

(Continued)

OTHER PUBLICATIONS

Chakraborti, "Verification of the Rayleigh scattering cross section", American Journal of Physics, Sep. 2007, vol. 75, No. 9, pp. 824-826.

(Continued)

*Primary Examiner* — Peggy Neils
(74) *Attorney, Agent, or Firm* — Gregg H. Rosenblatt

(57) ABSTRACT

Broadband solid state light sources include remote phosphor LED(s), short-wavelength direct emitting LED(s), and long-wavelength direct emitting LED(s). A diffuse or clear cover member covers these LEDs. Each remote phosphor LED includes an LED, a phosphor layer, and a dichroic reflector. The light sources can provide a broadband output light over a wide color range, and can do so efficiently while energizing a high percentage or proportion of the total number of LEDs in the system. The broadband output may for example exhibit a color difference of at least 0.2 in CIE chromaticity units, and/or a correlated color temperature difference of at least 4000 or 5000 Kelvin, while energizing more than half, or at least 60%, or at least 70%, of the total number of LEDs. Numbers of LEDs can be replaced with effective numbers of (Continued)

LEDs if LEDs of substantially different sizes are included in the light source.

20 Claims, 11 Drawing Sheets

(51) Int. Cl.
   *H01L 25/075* (2006.01)
   *F21V 3/04* (2006.01)
   *F21V 7/04* (2006.01)
   *H01L 33/46* (2010.01)
   *H01L 33/54* (2010.01)
   *F21V 3/02* (2006.01)
   *F21Y 101/00* (2016.01)

(52) U.S. Cl.
   CPC ............. *H01L 25/0753* (2013.01); *F21V 3/02* (2013.01); *F21Y 2101/00* (2013.01); *F21Y 2113/17* (2016.08); *F21Y 2115/10* (2016.08); *H01L 33/46* (2013.01); *H01L 33/54* (2013.01); *H01L 2924/0002* (2013.01)

(56) References Cited

U.S. PATENT DOCUMENTS

| | | | |
|---|---|---|---|
| 7,091,653 | B2 | 8/2006 | Ouderkirk |
| 7,847,303 | B2 | 12/2010 | Jung |
| 7,906,892 | B2* | 3/2011 | Choi .................... H01L 33/504 313/112 |
| 8,259,257 | B2 | 9/2012 | Akiba |
| 2006/0138435 | A1* | 6/2006 | Tarsa .................. H01L 25/0753 257/89 |
| 2007/0120089 | A1 | 5/2007 | Mao |
| 2008/0054280 | A1 | 3/2008 | Reginelli |
| 2009/0040754 | A1* | 2/2009 | Brukilacchio ....... A61B 1/0653 362/228 |
| 2009/0315053 | A1* | 12/2009 | Lee .................... C09K 11/7734 257/98 |
| 2010/0219428 | A1 | 9/2010 | Jung |
| 2011/0012143 | A1 | 1/2011 | Yuan |
| 2012/0091882 | A1 | 4/2012 | Haase |
| 2012/0104935 | A1 | 5/2012 | Haase |

FOREIGN PATENT DOCUMENTS

| | | |
|---|---|---|
| JP | 2010-066618 | 3/2010 |
| WO | WO 2007-114614 | 10/2007 |
| WO | WO 2012-061010 | 5/2012 |
| WO | WO 2012-091971 | 7/2012 |
| WO | WO 2012-091973 | 7/2012 |
| WO | WO 2012-091975 | 7/2012 |
| WO | WO 2013-055412 | 4/2013 |
| WO | WO 2013-180890 | 12/2013 |
| WO | WO 2014-042706 | 3/2014 |

OTHER PUBLICATIONS

Brainard, "Action Spectrum for Melatonin Regulation in Humans: Evidence for a Novel Circadian Photoreceptor", The Journal of Neuroscience, Aug. 15, 2001, vol. 21, No. 16, pp. 6405-6412.

Bues, LED-backlit computer screens influence our biological clock and keep us more awake, Journal of the Society for Information Display, 2012, vol. 20, No. 5, pp. 266-272.

Geisler-Moroder, "Estimating Melatonin Suppression and Photosynthesis Activity in Real-World Scenes from Computer Generated Images", Society for Imaging Science and Technology, 2010, pp. 346-352.

Glickman, "Ocular Input for Human Melatonin Regulation: Relevance to Breast Cancer", Neuroendocrinology Letters, 2002, vol. 23, pp. 17-22.

International Search Report for PCT International Application No. PCT/US2013/039281, mailed on Sep. 25, 2013, 4pgs.

Figueiro, M.G., et al., "Spectral Sensitivity of the Circadian System", *Proceedings of the SPIE, Third International Conference on Solid State Lighting*, vol. 5187 (Jan. 26, 2004), pp. 207-214.

Rea, M.S., "Light—Much more than vision." *Light and Human Health: EPRI/LRO Proceeding of 5th Lighting Research, Office Lighting Research Symposium* (2002); The Lighting Research Office of the Electric Power Research, Palo Alto, CA; pp. 1-15.

* cited by examiner

EFFICIENT LIGHTING SYSTEM WITH WIDE COLOR RANGE

FIELD OF THE INVENTION

This invention relates generally to light sources, with particular application to solid state light sources that incorporate a light emitting diode (LED) and a phosphor. The invention also relates to associated articles, systems, and methods.

BACKGROUND

Solid state light sources that emit broadband light are known. In some cases, such light sources are made by applying a layer of yellow-emitting phosphor onto a blue LED. As light from the blue LED passes through the phosphor layer, some of the blue light is absorbed, and a substantial portion of the absorbed energy is re-emitted by the phosphor as Stokes-shifted light at longer wavelengths in the visible spectrum, typically, yellow light. The phosphor thickness is small enough so that some of the blue LED light passes all the way through the phosphor layer, and combines with the yellow light from the phosphor to provide broadband output light having a white appearance.

Other LED-pumped phosphor light sources have also been proposed. In U.S. Pat. No. 7,091,653 (Ouderkirk et al.), a light source is discussed in which ultraviolet (UV) light from an LED is reflected by a long-pass reflector onto a phosphor layer. The phosphor layer emits visible (preferably white) light, which light is substantially transmitted by the long-pass reflector. The LED, phosphor layer, and long-pass filter are arranged in such a way that as UV light travels from the LED to the long-pass reflector it does not pass through the phosphor layer.

BRIEF SUMMARY

We have developed a new family of broadband solid state light sources. These light sources, which can for example be made for use as light bulbs in general lighting applications, combine one or more remote phosphor LEDs, one or more direct emitting short-wavelength LEDs, and one or more direct emitting long-wavelength LEDs in a single "hybrid" unit. A total number of such LEDs are covered by a bulb or other suitable cover member, which may be light-diffusing. Each remote phosphor LED includes an LED, a phosphor layer, and a dichroic reflector. Excitation light from the LED is reflected by the dichroic reflector onto the phosphor layer to generate phosphor light, which is substantially transmitted by the dichroic reflector. At least some light from the direct emitting short- and long-wavelength LEDs propagates to the cover member without being substantially reflected by (e.g. by not being incident on) any dichroic reflector. The light source can provide a broadband output light over a wide color range and, unlike prior systems, can do so efficiently while energizing a high percentage or proportion of the total number of LEDs in the system. For example, the broadband output may exhibit a color difference of at least 0.2 in CIE chromaticity units, and/or a correlated color temperature difference of at least 4000 or 5000 Kelvin, while energizing more than half, or at least 60%, or at least 70%, of the total number of LEDs.

We describe herein, inter alia, hybrid lighting systems that emit broad band light. The lighting systems may include a total number N of LEDs, and a light-transmissive cover member that covers the N LEDs and transmits the broad band light. The light-transmissive cover may be light-diffusing, or, substantially clear and not light-diffusing. The N LEDs include a number N1 of pump LEDs, a number N2 of direct emitting short-wavelength LEDs, and a number N3 of direct emitting long wavelength LEDs. The numbers N1, N2, and N3 are each greater than zero, and N1+N2+N3 may be equal to or less than N. Each of the N1 pump LEDs is configured as a remote phosphor LED, wherein the pump LED is combined with a dichroic reflector and a phosphor layer such that at least some light from the pump LED is reflected by the dichroic reflector onto the phosphor layer to cause the phosphor layer to emit phosphor light. The dichroic reflector is also configured to substantially transmit the phosphor light. The direct emitting short-wavelength LED(s) have peak output wavelengths in a range from 400 to 500 nm, or from 420 to 480 nm, or from 445 to 400 nm, and are disposed to emit at least some light that propagates from the short-wavelength LED to the cover member without being substantially reflected by (e.g. by not being incident on) any dichroic reflector. The direct emitting long-wavelength LED(s) have peak output wavelengths in a range from 600 to 700 nm, or from 600 to 650 nm, and are disposed to emit at least some light that propagates from the long-wavelength LED to the cover member without being substantially reflected by (e.g. by not being incident on) any dichroic reflector.

The pump LEDs, the direct emitting short-wavelength LEDs, and the direct emitting long-wavelength LEDs are preferably wired for independent electrical control, so that different groups of the LEDs can be energized. The broad band light transmitted by the cover member has a color that is a function of which ones of the N LEDs are energized. The N LEDs are preferably configured such that the broad band transmitted light can have a first color associated with a first group of the N LEDs being energized, and a second color associated with a second group of the N LEDs being energized. Further, the first and second colors preferably have a color difference of at least 0.2 in CIE chromaticity units, and/or a correlated color temperature difference of at least 4000 or 5000 Kelvin, and the first and second groups of the N LEDs preferably involve energizing more than half, or at least 60%, or at least 70%, of the N LEDs.

The first and second groups of the N LEDs may each involve energizing all of the N1 pump LEDs. The first and second colors may be sufficiently close to the Planckian locus such that they have respective first and second correlated color temperatures.

The number N1 may be at least 2 such, that there are a plurality of remote phosphor LEDs. The plurality of remote phosphor LEDs may utilize phosphor layers having a same phosphor composition. The plurality of remote phosphor LEDs may also or alternatively utilize phosphor layers having different phosphor compositions. The numbers N1, N2, and N3 may be related by the inequality N1>N2+N3.

For at least one, some, or all of the remote phosphor LED(s) in the lighting system, the pump LED, the phosphor layer, and the dichroic reflector are preferably arranged such that at least some excitation light propagates from the pump LED to the dichroic reflector without passing through the phosphor layer. One, some, or all of the pump LED(s) may have a peak wavelength of less than 420 nm.

The system may also include a control system configured to drive the N1 pump LEDs, the N2 direct emitting short-wavelength LEDs, and the N3 direct emitting long-wavelength LEDs independently. The control system may be configured to provide first and second control outputs, the first control output being effective to energize the first group of the N LEDs to provide the first color for the transmitted broad band light, and the second control output being effective to energize the second group of the N LEDs to provide the second color for the transmitted broad band light. The control system can also be configured so that the N1 pump LEDs, the N2 direct emitting short-wavelength LEDs, and the N3 direct emitting long-wavelength LEDs provide the transmitted broad band light with a range of colors between the first color and the second color, e.g. by dimming some or all of the N1, N2 and N3 LEDs by varying amounts.

If one or more of the LEDs has a size (e.g. an emitting area) that differs greatly from one or more other LEDs, then the numbers (N, N1, N2, N3) of LEDs in the foregoing descriptions, comparisons, and relationships may be replaced with more generalized "effective numbers" (NE, NE1, NE2, NE3), where the effective number is the number of the LEDs multiplied by their respective sizes (e.g. by their emitting areas), or by a factor which is proportional to their respective sizes.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION OF ILLUSTRATIVE EMBODIMENTS

Figure 1:
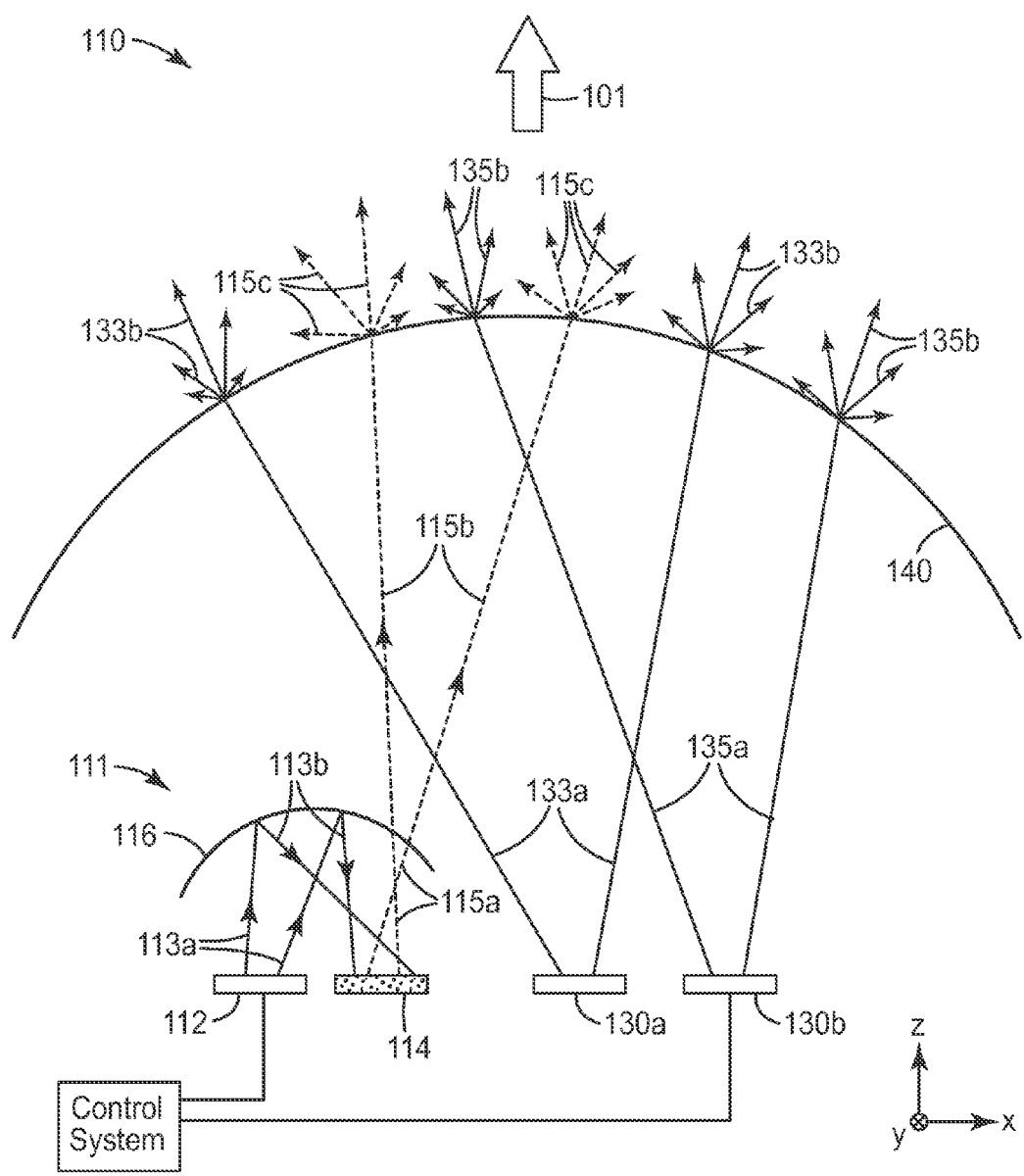
FIG. 1 is a schematic side- or cross-sectional view of a broadband light source that combines a remote phosphor LED and two direct emitting LEDs.

We have found that broadband solid state light sources with particularly beneficial design features can be constructed by combining the light output of one or more remote phosphor LEDs, the light output of one or more direct emitting short-wavelength (e.g. blue) LEDs, and the light output of one or more direct emitting long-wavelength (e.g. red) LEDs. The resulting hybrid light sources may have a robust solid state design, and may make efficient use of LEDs and phosphor materials. In particular, the light sources are designed to provide a broadband output light over a wide color range, and can do so efficiently while energizing a high percentage or proportion of the total number of LEDs in the system. The light sources may also provide output colors sufficiently close to the Planckian locus such that they have respective correlated color temperatures. The light sources can be used as light bulbs in general lighting applications, e.g. to provide white light of different color temperatures or correlated color temperatures, or can be used in other more specialized applications.

In this application, "light emitting diode" or "LED" refers to a diode that emits light, whether visible, ultraviolet, or infrared, although in many practical embodiments the emitted light will have a peak wavelength in a range from about 340 to 650 nm, or from about 400 to 650 nm. The term LED includes incoherent encased or encapsulated semiconductor devices marketed as "LEDs", whether of the conventional or super radiant variety, as well as coherent semiconductor devices such as laser diodes, including but not limited to vertical cavity surface emitting lasers (VCSELs). An "LED die" is an LED in its most basic form, i.e., in the form of an individual component or chip made by semiconductor processing procedures. For example, the LED die may be formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can also be used, as well as inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant over an LED die and an associated reflector cup. The LED may be grown on one of several substrates. For example, GaN LEDs may be grown by epitaxy on sapphire, silicon, and gallium nitride. An "LED" for purposes of this application should also be considered to include organic light emitting diodes, commonly referred to as OLEDs.

An LED that is used to excite or "pump" a separate phosphor material may be referred to herein as a "pump LED". The phosphor absorbs some or all of the light emitted by the pump LED, and re-emits some of the absorbed energy as Stokes-shifted (longer wavelength) phosphor light. For purposes of the present application, the phosphor light is typically substantially within the visible wavelength range, and the excitation light from the pump LED is typically at or near the short wavelength end of the visible light spectrum (e.g. blue-green, blue, or violet), or in the near ultraviolet. An LED not used to excite or pump a separate phosphor material may be referred to herein as a "non-pump LED" or a "direct emitting" LED. The term "remote phosphor LED", as used herein, may refer to a subsystem that includes: at least one pump LED; at least one phosphor layer or body that is effectively structurally separated from the pump LED but optically coupled thereto; and a dichroic reflector that substantially reflects light from the pump LED to the phosphor and substantially transmits the Stokes-shifted phosphor light. Preferably, these components are arranged such that the excitation light propagates from the pump LED to the dichroic reflector without passing through the phosphor layer.

FIG. 1 shows in rough schematic form an exemplary broadband solid state light source 110. The source 110 includes a remote phosphor LED 111, a direct emitting short-wavelength LED 130a, a direct emitting long-wavelength LED 130b, and a light-transmissive cover member 140. Mounting structures and other components (not shown) are used to hold the labeled components in fixed spatial positions with respect to each other so as to produce a desired broadband output light 101.

The cover member 140 may be made of glass, plastic, or other suitable light-transmissive material. The cover member 140 may be in the form of a bulb, such as any of the known bulbs used in conventional light bulbs for general lighting. In this regard, some or substantially all of the space between the cover member 140 and the remote phosphor LED 111 and the direct emitting LEDs 130a, 130b may be air, or an inert gas, or vacuum. Alternatively, such space may be partially or completely filled with a solid, liquid, or otherwise tangible light-transmissive material. The cover member may be made of only one layer or optical element, or it may comprise a plurality of layers or optical elements, e.g., an outer bulb that encloses a smaller inner bulb. The cover member 140 may be "frosted", i.e., adapted to scatter light, or it may be clear with little or no light scattering. The bulb may also attach to a base member that is compatible with conventional light fixtures, e.g., the base member may be threaded or otherwise adapted to mate with existing lighting sockets, and may have electrical contacts as needed and suitable circuitry to convert residential or commercial electrical service voltage levels to voltages and currents that are compatible with LEDs. The source 110 may also couple to a control system (see FIG. 1) that energizes the various LEDs in the source 110, or such a control system may be included as a component within the source 110.

The remote phosphor LED 111 is a lighting subsystem that includes at least one pump LED 112, at least one phosphor layer 114, and a dichroic reflector 116. The pump LED 112 emits light 113a capable of exciting the phosphor. Only two rays of the excitation light 113a are shown in the figure, but the reader will understand that the LED ordinarily emits excitation light over a wide range of directions (e.g. in a Lambertian distribution), and over a band of wavelengths. The excitation light 113a is typically at or near the short wavelength end of the visible light spectrum, or in the near ultraviolet. For example, the excitation light may have a peak wavelength in a range from 340 to 480 nm, or from 400 to 470 nm, or at a wavelength of 420 nm or less. Although only one pump LED 112 is shown in the figure, more than one may be included in a given remote phosphor LED subsystem. The excitation light 113a is substantially reflected by the dichroic reflector 116 as reflected excitation light 113b, although some of the excitation light may be transmitted by the dichroic reflector.

The remote phosphor LED 111 also includes a phosphor layer 114, which is effectively structurally separated from, but optically coupled to, the pump LED 112. The phosphor layer 114 absorbs some or all of the incident (reflected) excitation light 113b, and re-emits some of the absorbed energy as longer wavelength phosphor light 115a. The phosphor light 115a is typically emitted by the phosphor material in all directions, and such light is itself typically broadband as discussed further below. Some of the phosphor light 115a propagates towards the dichroic reflector 116. Such light is substantially transmitted by the reflector 116 to produce transmitted phosphor light 115b. In some cases, the reflector 116 may also transmit some (typically a minor portion) of the excitation light 113a. The transmitted phosphor light 115b, as well as any light from the pump LED 112 that is transmitted through the dichroic reflector 116, then propagates onward to the cover member 140, where is transmitted, optionally with a desired degree of haze or scatter as illustrated, as phosphor light 115c.

The dichroic reflector 116 may in some cases conform to the outer surface of a lens member, which is not shown in FIG. 1 for generality but is shown in other figures herein. The dichroic reflector 116 and the outer lens surface (if present) may have a concave and/or curved shape, so that the light emitted by the pump LED 112, and reflected by the reflector 116, is directed predominantly onto the phosphor layer 114. The dichroic reflector may be shaped to form at least an approximate image of the pump LED 112 at or in the vicinity of the phosphor layer 114, e.g., to maximize efficiency by maximizing the amount of reflected excitation light that impinges on, and/or is actually absorbed by, the phosphor layer 114.

Dichroic reflectors are also sometimes referred to as dichroic mirrors or dichroic filters. They are designed to have a high reflectivity and low transmission for some optical wavelengths, and a low reflectivity and high transmission for other optical wavelengths. Such reflectors ordinarily have negligible absorption, such that any light that is not reflected is substantially transmitted, and vice versa, at least over visible, near infrared, and near-ultraviolet wavelengths. Such reflectors comprise stacks of optically thin microlayers, typically in an alternating arrangement of materials having a large refractive index mismatch, such as alternating layers of silicon dioxide and titanium dioxide, but other suitable inorganic or organic materials may also be used. Such reflectors may be made by vacuum deposition of the alternating layers on a glass or other suitable substrate, e.g., directly on the outer surface of a lens member, or on a film or substrate that can be subsequently applied to such a surface. Alternatively, suitable reflective films may be made by a continuous process that may involve coextrusion of alternating polymer materials and stretching the resulting multilayer polymer web, e.g. as described in U.S. Pat. No. 5,882,774 (Jonza et al.) and U.S. Pat. No. 6,783,349 (Neavin et al.). Regardless of the materials used in the dichroic reflector and the method of manufacture used, the reflector is provided with a layer thickness profile for the stack of microlayers that is tailored to provide the desired reflection characteristics as a function of wavelength. The thickness profile may be tailored to provide a dichroic reflector that operates as a long pass filter or a notch filter, for example, whereby relatively long wavelength phosphor light is substantially transmitted over a range of incidence angles, and relatively short wavelength LED excitation light is predominantly reflected. The dichroic reflector may for example have a transmission of at least 50%, or at least 60%, or at least 70% for the phosphor light. The dichroic reflector may in some cases substantially reflect visible blue light and substantially transmit visible yellow light. In some cases the dichroic reflector may be or comprise a multilayer mirror film, a reflective polarizer, and/or a partially polarizing reflector such as a mirror that, at a given wavelength, reflects orthogonal polarization states differently.

The reflective and transmissive properties of a dichroic reflector typically change as the incidence angle of light impinging on the reflector changes. For example, the dichroic reflector 116 may have a greater transmission for LED light rays that are obliquely incident on the reflector compared to LED light rays that are normally incident on the reflector. This characteristic may be used to produce a remote phosphor solid state light source whose output color can be adjusted by controlling the relative drive strengths of multiple LEDs arranged beneath the lens assembly, as discussed more fully in commonly assigned PCT Publ. No. WO 2012/091973.

The phosphor layer 114 contains one or more suitable phosphor materials that fluoresce or otherwise emit light that is Stokes shifted relative to the absorbed LED light. The phosphor material preferably absorbs light in a range that overlaps in wavelength with the emission spectrum of the LED, such that the LED can excite the phosphor and cause it to fluoresce or otherwise emit phosphor light. In many cases, a given phosphor material may absorb light in the ultraviolet, blue, and/or blue-green portion of the electromagnetic spectrum, and may emit light in the visible or near-visible region. The emitted phosphor light is typically broadband, e.g., it may have a spectral width of at least 100 nanometers. The broadband phosphor light may be distributed in a continuous broad band, or it may have a spiked distribution as in the case of a collection of spaced-apart narrow emission lines, or it may be a combination of narrow emission lines and a continuous broad band. Exemplary phosphor materials include known fluorescent dyes and phosphors. Cerium-doped yttrium aluminum garnet (Ce:YAG) is one example of a phosphor that may be used. Other rare-earth doped garnets or other rare-earth doped materials may also be suitable, e.g., europium- and/or strontium-doped silicates, nitrides, and aluminates, depending on design details and constraints of the light source. Suitable phosphor materials may include organic and inorganic fluorescent or phosphorescent materials, such as doped inorganic oxides or nitrides, quantum dots, and semiconductors including II-VI and III-V materials.

The phosphor layers disclosed herein may be or comprise a layer of light-transmissive binder or matrix material in which is dispersed one or more types of fluorescent particles, e.g. rare-earth doped garnets or other fluorescent materials mentioned herein, in desired concentrations. The binder or matrix material may be organic or inorganic. Silicone is one example of a suitable binder material. Alternatively, ceramics may be used as binder materials. An advantage of using ceramics is substantially greater thermal conductivity than materials such as silicone. The greater thermal conductivity provides the phosphor layer as a whole with a greater thermal conductivity, which can be used in connection with a heat sink to maintain the phosphor layer at a lower operating temperature for improved efficiency.

In some cases, the phosphor layer 114 may be or include a patterned phosphor. The patterned phosphor can include two or more phosphors of differing emission bands. The phosphor layer 114 may further be or include multiple patterned phosphors spatially separated from one another. The patterns can comprise singular areas with one color each, formed as stripes, raster patterns, or any other aligned pattern. In one example, phosphor layer 114 can include a green phosphor first portion/pattern and a red phosphor second portion/pattern. As these phosphor portions are separated, re-absorption or Stokes shift-related efficiency losses can be reduced. The portions/patterns can be separated via a space or structure, such as a wall, disposed between the different phosphor patterns. Patterning can be accomplished via conventional procedures, such as ink jet printing. Alternatively, the different phosphor layer portions/patterns can be touching or overlapping in certain regions.

The remote phosphor LED 111 may also include a broadband reflector (not shown in FIG. 1) beneath or behind the phosphor layer 114. At least some excitation light may pass through the phosphor layer 114 before reaching the broadband reflector. The broadband reflector preferably provides high reflectivity for both the LED excitation light and the longer wavelength phosphor light. The degree of transparency or of transmission of the phosphor layer to LED light can be tailored to increase the broadband light output of the lighting system. Such increase can actually be achieved by decreasing the amount of phosphor used in the phosphor layer. The single pass transmission of the phosphor layer to the LED light may be from 30 to 65%, and the reflectivity of the broadband reflector may be at least 90, 94, or 98%. Further details are provided in commonly assigned PCT Patent Publ. No. WO 2012/091975.

In addition to the remote phosphor LED 111, the source 110 also includes a direct emitting short-wavelength LED 130a and a direct emitting long-wavelength LED 130b. We refer to the LEDs 130a, 130b as direct emitting because light 133a, 135a emitted by these LEDs is not predominantly used to pump a phosphor layer. Rather, such LED light 133a, 135a propagates from the respective LEDs 130a, 130b to the cover member 140 without being substantially reflected by any dichroic reflector, including the dichroic reflector 116. In FIG. 1, this occurs due to the fact that the LEDs 130a, 130b are situated such that no significant amount of their emitted light 133a, 135a impinges upon the dichroic reflector 116, or any other dichroic reflector. Note that LEDs typically emit light over a wide angular range, and, therefore, depending on the design details of the dichroic reflector 116 and the phosphor layer 114, and their orientation relative to the LEDs 130a, 130b, a small amount of LED light 133a, 135b may impinge upon the dichroic reflector 116 and phosphor layer 114 and produce a very small amount of fluorescence. The LEDs 130a, 130b may nevertheless be referred to as non-pump LEDs or direct emitting LEDs because a substantial majority of their respective emitted LED light propagates from the LED (130a or 130b) to the cover member 140 without being substantially reflected by any dichroic reflector, and without producing significant fluorescence in any separate phosphor material.

An LED may also be referred to as a non-pump or direct emitting LED even if most or all of the light emitted by the LED impinges upon a dichroic reflector, as long as the dichroic reflector substantially transmits, rather than reflects, such LED light. For example, the light source 110 of FIG. 1 may be modified such that the direct emitting long-wavelength LED 130b is situated close to the pump LED 112 and phosphor layer 114, behind or beneath the dichroic reflector 116, such that most or all of its emitted long-wavelength light 135a is intercepted by the dichroic reflector 116. In such a modified light source, the LED 130b would still be considered a direct emitting LED, as long as the dichroic reflector 116 substantially transmits, rather than reflects, that long-wavelength light. Preferably, the dichroic reflector reflects less than 20%, or less than 10%, or less than 5%, or less than 1%, of the total amount of light emitted by a direct emitting LED. Since absorption in the dichroic reflector is typically negligible, these values correspond respectively to transmission through the dichroic reflector of more than 80%, or more than 90%, or more than 95%, or more than 99%.

Similar to the transmitted phosphor light 115b, the LED light 133a, 135b propagates onward to the cover member 140, where it is transmitted, optionally with a desired degree of haze or scatter as illustrated, as transmitted LED light 133b, 135b. The transmitted LED light 133b, 135b, the transmitted phosphor light 115c, and any excitation light transmitted through the dichroic reflector 116 and the cover member 140, combine to produce the broadband output light 101 of the source 110. The output light 101 is shown schematically in the figure as a single arrow, but the reader will understand that the output light 101 may be distributed over a wide range of directions, e.g., in a Lambertian or near-Lambertian distribution. The output light 101 may or may not be symmetrical about an optical axis of the source 110, e.g., an axis parallel to the z-axis of a Cartesian x-y-z coordinate system. The spectral distribution of the transmitted phosphor light 115c differs from that of the transmitted LED light 133b, which in turn differs from that of the from that of the transmitted LED light 135b, and since these light components are combined in the output light 101, the output light 101 typically has a spectral distribution that is greater than that of any of the light components individually.

The output light 101 is thus broadband, e.g., it may have a spectral width of at least 100, or 150, or 200, or 250 nanometers. The output light 101 may be distributed spectrally in a continuous broad band, or it may have a spiked distribution as in the case of a collection of spaced-apart narrow emission lines, or it may be a combination of narrow emission lines and a continuous broad band. CIE chromaticity coordinates, composed of a CIE x color coordinate and a CIE y color coordinate, characterize a mathematically defined color space that was developed by the Commission international de l'eclairage ("CIE", or International Commission on Illumination) in 1931. The x and y color coordinates should not be confused with x and y coordinates associated with physical position or displacement. Unlike the physical coordinates, the (x,y) chromaticity coordinates are unitless. The chromaticity coordinates can be conveniently used to quantitatively describe or define colors and color differences. For example, for purposes of this application, one may define white light as light whose CIE color coordinates (x,y) satisfy $0.25 \leq x \leq 0.45$ and $0.25 \leq y \leq 0.45$, with different points within that defined region corresponding to different shades or hues of white light, e.g., warm (reddish) white vs. cool (bluish) white. By appropriate selection of the spectral content (color) of the various LEDs in the light source 110 (including the choice of phosphor in the remote phosphor LEDs) and appropriate selection of which of the LEDs to turn "on" or energize, the output light 101 may be made to have a substantially white color to an ordinary observer. Preferably, selections can also be made to provide the output light 101 with white as well as non-white colors that lie on or near the well-known Planckian locus, or even non-white colors that do not lie near the Planckian locus. The Planckian locus is the curve on the CIE chromaticity diagram representative of the color of an ideal blackbody emitter, the color of such an emitter depending only on the temperature of the blackbody. A color sufficiently close to the Planckian locus (including a color lying on the Planckian locus) can be characterized by a correlated color temperature. If the color lies precisely on the Planckian locus, then its correlated color temperature can be said to equal the color temperature, i.e., the temperature (expressed in absolute temperature units of Kelvin) of a blackbody having the same color.

To provide a wide range of available colors of the broadband output light 101, the direct emitting LEDs 130a, 130b are preferably selected to emit light at opposite ends of the visible spectrum. Thus, LED 130a preferably emits relatively short wavelength visible light, e.g., light in or near the blue region of the spectrum, and LED 130b preferably emits relatively long wavelength visible light, e.g., light in or near the red region of the spectrum. The LED 130a may for example have a peak output wavelength in a range from 400 to 500 nm, or from 420 to 480 nm, or from 445 to 500 nm, and the LED 130b may have a peak output wavelength in a range from 600 to 700 nm, or from 600 to 650 nm. The design of the remote phosphor LED 111 can further help widen the range of available colors of the output light by minimizing the amount of blue light emitted by the lighting subsystem of remote phosphor LED 111. In this regard, the design details of the LED 112 and the dichroic reflector 116 can be readily selected so that substantially less blue light is emitted by the remote phosphor LED 111 than would be emitted from an alternative subsystem in which a layer of phosphor is coated onto or covers a blue-emitting pump LED die. This is because in the latter case, the phosphor layer cannot be made so thick or optically dense that little or no blue light from the pump LED is transmitted, without also substantially degrading or reducing the amount of phosphor light that is emitted by the phosphor layer. However, despite this limitation of phosphor-coated pump LED subsystems, such subsystems may also be incorporated into the light source 110 if desired. Blue light emitted by the lighting subsystem of remote phosphor LED 111 can also be reduced by selecting pump LED(s) that predominantly emit at wavelengths shorter than about 420 nm, e.g., pump LED(s) whose peak wavelengths are less than about 420 nm.

FIG. 1 shows the light source 110 as having only the one remote phosphor LED 111, and only the one direct emitting short-wavelength LED 130a, and only the one direct emitting long-wavelength LED 130b, for a total of 3 LEDs. However, in many cases it is desirable to provide the light source 110 with more than 3 LEDs. For example, more remote phosphor LEDs, and/or more direct emitting short-wavelength LEDs, and/or more direct emitting long-wavelength LEDs may be included. In general, the light source 110 may have a total number N of LEDs, where the number N may include N1 pump LEDs (each such pump LED being configured as a remote phosphor LED), and N2 direct emitting short-wavelength LEDs, and N3 direct emitting long-wavelength LEDs, and where N1, N2, and N3 are all greater than zero. In exemplary embodiments N1 may be at least 2, and there may be a plurality of remote phosphor LEDs, and N1 may be greater than the sum of N2 and N3. In embodiments in which no other LEDs are included in the light source other than the N1 pump LEDs (configured as remote phosphor LEDs), the N2 direct emitting short-wavelength LEDs, and the N3 direct emitting long-wavelength LEDs, N is equal to N1+N2+N3. In some embodiments, however, such as ones that also include one or more additional pump LEDs that are not configured as remote phosphor LEDs, N is greater than N1+N2+N3.

Rather than being all hard-wired together, the N LEDs are preferably wired for independent electrical control. In this way, a control system (see FIG. 1) can connect to the LEDs individually or in sub-groups so that different selected groups of the N LEDs can be energized at different times, and groups of energized LEDs can be selected so that the color of the output light 101 changes as a function of time by operation of the control system. We have found that substantial color shifts or differences can be achieved, e.g., a color difference of at least 0.2 in CIE chromaticity units, and/or a difference in correlated color temperature of at least 4000 or 5000 Kelvin, while also operating the light source 110 at high efficiency as measured by the percentage or proportion of the total number N of LEDs in the system that are energized by the control system. In particular, the mentioned color differences can be realized while energizing more than half, or at least 60%, or at least 70%, of the total number N of LEDs. Furthermore, the mentioned color differences can be realized, in at least some cases, while energizing all N1 of the pump LEDs.

Furthermore, by combining the direct emitting LEDs and the remote phosphor LED(s) into one light source, the light source may provide its broadband output light (e.g. white light) more efficiently than if only remote phosphor LEDs were used, or if only direct emitting LEDs were used. LED technology and phosphor technology has been evolving and will continue to evolve. With existing or later-developed technology, it may be most efficient: to produce light of particular wavelength bands or colors (e.g. red light and blue light) with a direct emitting LED, rather than a remote phosphor LED; and to produce light of a different particular wavelength band or color (e.g. green light) with a remote phosphor LED (using for example a high efficiency blue or UV pump LED in combination with a green-emitting phosphor), rather than a direct emitting LED. By combining the most efficient producers of the constituent components (colors) of the broadband (e.g. white) output light in a single source, the overall efficiency of the source can be maximized or optimized.

Turning now to FIGS. 2a-2d and 3, we provide in connection with these figures further information relating to suitable remote phosphor LEDs. Reference is also made to the following commonly assigned PCT applications, which describe various types of remote phosphor LEDs that may be used in, or readily adapted for use in, the presently disclosed light sources: PCT publication WO 2012/091971 (Ouderkirk et al.); WO 2012/091973; WO 2013/055412; and WO 2012/091975.

Figure 2A:
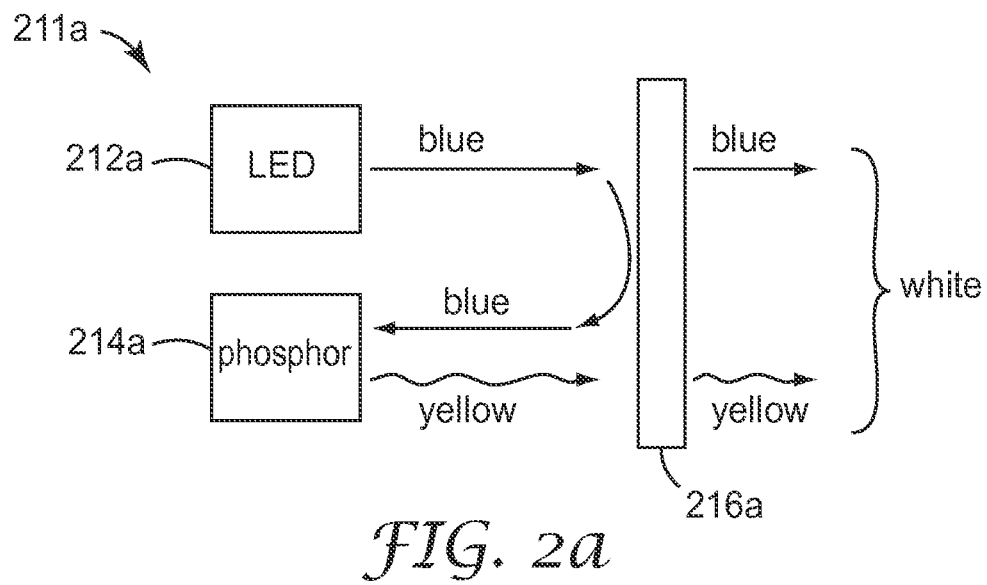
FIGS. 2a through 2d are functional diagrams that demonstrate some different color or wavelength combinations that can be used in a given remote phosphor LED.

Several different color or wavelength combinations that can be used in a given remote phosphor LED are shown schematically in FIGS. 2a through 2d. These figures and their descriptions should be considered to be exemplary and not limiting. In FIG. 2a, a remote phosphor LED 211a includes a pump LED 212a that emits visible blue excitation light, most of which is reflected and preferably imaged onto a phosphor layer 214a by a dichroic reflector 216a. The phosphor layer emits phosphor light of a particular color, e.g., yellow. The color yellow is only exemplary, and other phosphor light of colors may also be used. The yellow phosphor light is substantially transmitted by the dichroic reflector 216a. In this embodiment, the dichroic reflector is assumed to have a significant transmission for the excitation light from the pump LED 212a. Although the transmission may be significant, it is typically less than 50% e.g., less than 40, 30, 20, or 10%, and the reflectivity for the excitation light is typically greater than 50%, e.g., at least 60, 70, 80, or 90%. In any case, some of the blue excitation light is transmitted through the dichroic reflector 216a, and combines with the yellow phosphor light to provide a white light output for the remote phosphor LED 211a. If the yellow phosphor light is replaced with phosphor light of a different color, the output of the remote phosphor LED 211a will have a non-white color.

Figure 2B:
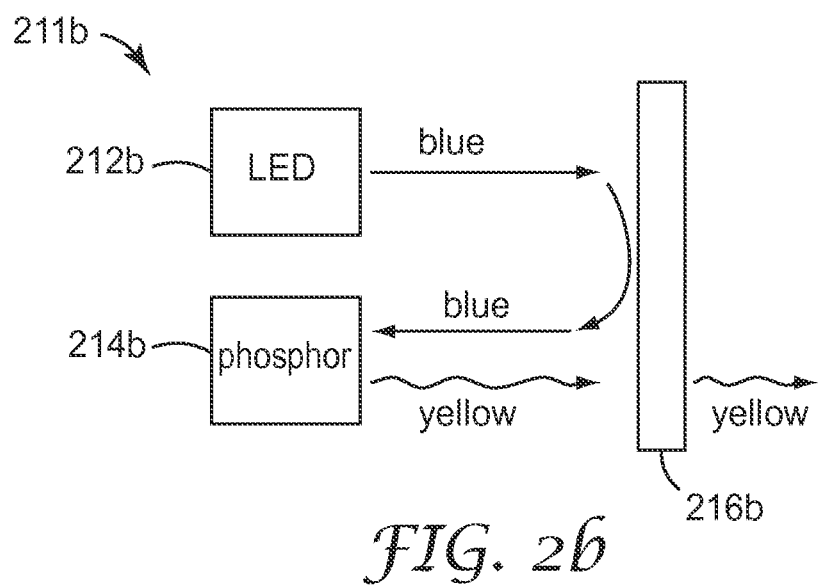

In FIG. 2b, a remote phosphor LED 211b includes a pump LED 212b that emits visible blue excitation light, most or all of which is reflected and preferably imaged onto a phosphor layer 214b by a dichroic reflector 216b. The phosphor layer emits phosphor light of a particular color, e.g., yellow. The color yellow is only exemplary, and other phosphor light of colors may also be used. The yellow phosphor light is substantially transmitted by the dichroic reflector 216b. In this embodiment, the dichroic reflector is assumed to have little or no transmission for the excitation light from the pump LED 212b. Therefore, little or none of the blue excitation light is transmitted through the dichroic reflector 216b. The yellow phosphor light, by itself, provides the light output for the remote phosphor LED 211b. If the yellow phosphor light is replaced with phosphor light of a different color, the output of the remote phosphor LED 211b will have an output of such different color.

Figure 2C:
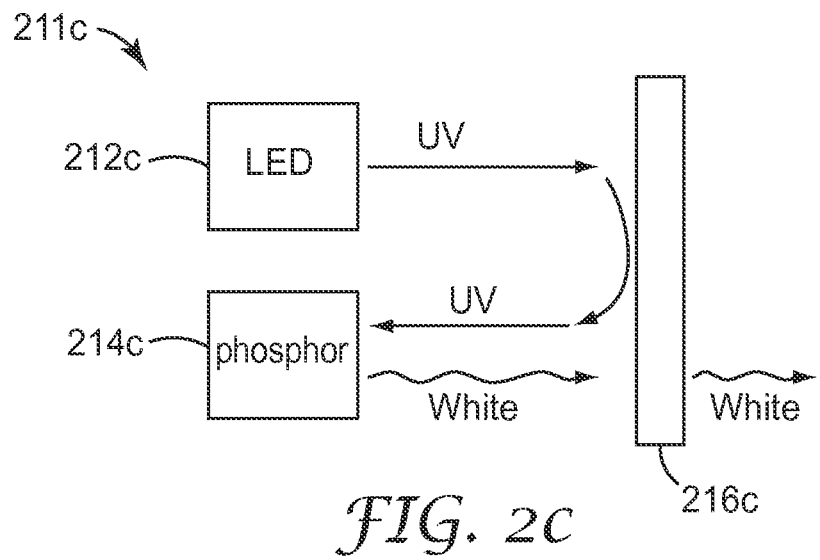

In FIG. 2c, a remote phosphor LED 211c includes a pump LED 212c that emits ultraviolet (UV) excitation light, most or all of which is reflected and preferably imaged onto a phosphor layer 214c by a dichroic reflector 216c. The phosphor layer emits white phosphor light. The white phosphor light is substantially transmitted by the dichroic reflector 216c. In this embodiment, the dichroic reflector is assumed to have little or no transmission for the excitation light from the pump LED 212c. Therefore, little or none of the UV excitation light is transmitted through the dichroic reflector 216c. The white phosphor light, by itself, provides the light output for the remote phosphor LED 211c.

Figure 2D:
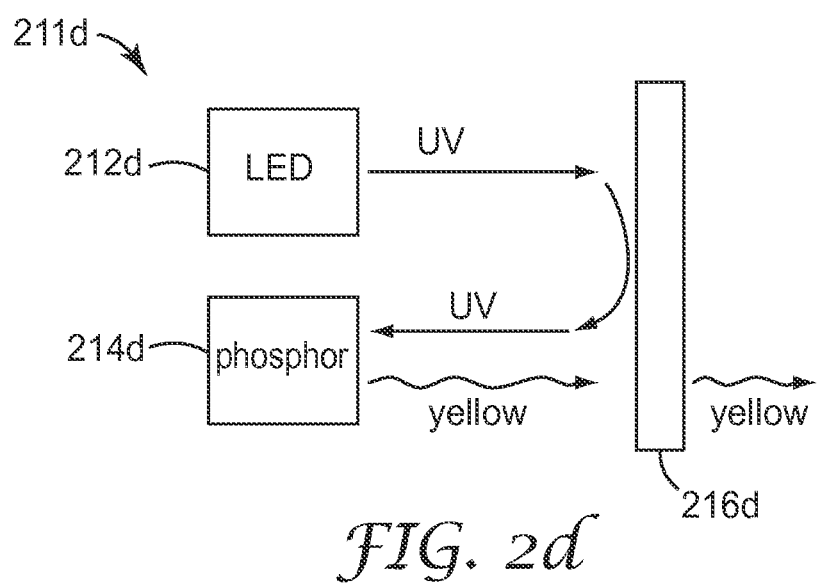

FIG. 2d shows a remote phosphor LED 211d similar to that of FIG. 2c, except that the phosphor layer emits light of a particular non-white color, e.g., yellow. Thus, a remote phosphor LED 211d includes a pump LED 212d that emits UV excitation light, most or all of which is reflected and preferably imaged onto a phosphor layer 214d by a dichroic reflector 216d. The phosphor layer emits phosphor light of a particular non-white color, e.g., yellow. The color yellow is only exemplary, and other phosphor light of colors may also be used. The yellow phosphor light is substantially transmitted by the dichroic reflector 216d. In this embodiment, the dichroic reflector is assumed to have little or no transmission for the excitation light from the pump LED 212d. Therefore, little or none of the UV excitation light is transmitted through the dichroic reflector 216d. The yellow phosphor light, by itself, provides the light output for the remote phosphor LED 211d. If the yellow phosphor light is replaced with phosphor light of a different color, the output of the remote phosphor LED 211d will have an output of such different color.

Some remote phosphor LEDs that can be adapted for use in the disclosed embodiments can be found in the above-cited PCT Publ. No. WO 2012/091973. In the '973 publication, the remote phosphor LEDs are broadband light sources in which a phosphor layer is excited by light from multiple LEDs. A dichroic reflector reflects light from the LEDs onto the phosphor layer. First and second LEDs are responsible for first and second broadband portions respectively of a broadband output light of the source, each such broadband portion being broadband and nominally white. The device components are configured and arranged so that the first and second broadband light portions have different CIE color coordinates. These portions combine to yield a resultant color for the overall broadband light output of the source, which resultant color is a function of the relative amounts of the first and second broadband light portions. An open-loop or closed-loop controller can independently drive the LEDs to provide a desired mix of the broadband light portions so that the overall broadband light output has a color in a desired design space.

Figure 3:
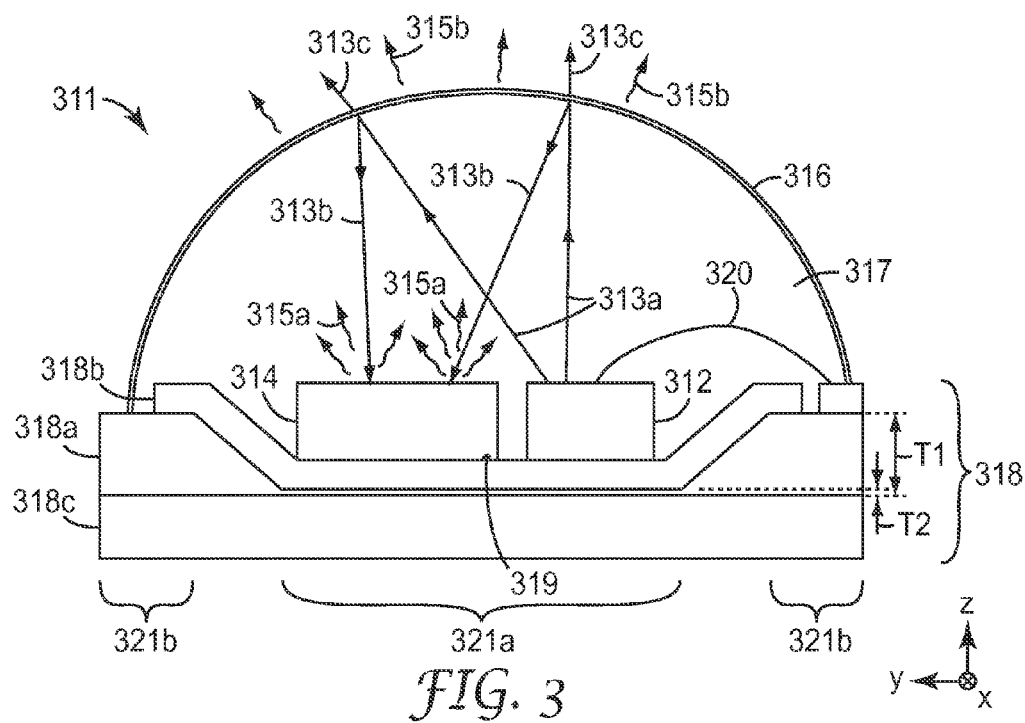
FIG. 3 is a schematic perspective view of a remote phosphor LED.

Another remote phosphor LED that can be adapted for use in the disclosed embodiments is shown schematically in FIG. 3, further details of which can be found in the above-cited PCT Publ. No. WO 2012/091971. In FIG. 3, a remote phosphor LED 311, also referred to herein as subsystem 311, is shown in the context of a Cartesian x-y-z coordinate system. The subsystem 311 includes a blue-light emitting LED 312 disposed on a substrate 318, the substrate also having thereon a phosphor layer 314 that emits longer wavelength visible light when exposed to the blue light from the LED. The LED 312 may connect to a conductive trace by a wire bond 320.

The subsystem 311 also includes a dichroic reflector 316 having a convex shape that opens toward and encompasses the LED and the phosphor layer 314. The center of curvature for the reflector 316 is marked by a point 319. The LED 312 is positioned relatively close to the point 319, and so is the phosphor layer 314. The phosphor layer 314 may be larger than the LED 312, e.g., the phosphor layer may have a larger surface area than that of the pump LED, as illustrated.

Blue light 313a emitted by the LED 312 is partially reflected by the dichroic reflector 316 to produce reflected LED light 313b, and partially transmitted to produce transmitted LED light 313c. The reflected LED light 313b is directed onto the phosphor layer 314, which excites the phosphor and causes the phosphor layer to emit longer wavelength light 315a. This longer wavelength light is highly transmitted by the dichroic reflector 316 to produce phosphor light 315b. The transmitted light 313c and transmitted light 315b combine spatially to provide broadband output light, such as white light, for the subsystem source 311. The interior space 317 may comprise a suitable light-transmissive glass or polymer material that encapsulates the LED and the phosphor, and the dichroic reflector may be applied to the outer surface of such an encapsulant. Alternatively, the interior space 317 may be unfilled.

In subsystem 311, the substrate 318 is preferably thin for flexibility, greater heat conduction (and lower thermal resistance) to an underlying heat sink (not shown), and for space savings. Although generally thin, the substrate 318 is desirably molded, etched, or otherwise shaped to be even thinner in a cavity region 321a compared to an adjacent or neighboring region 321b, these regions being shown as separated by a beveled transition region. The reduced thickness, which provides an even greater heat conduction in the cavity region relative to the neighboring region, is desirably associated with the reduced thickness of a dielectric layer 318a which forms part of the substrate. In the figure, the dielectric layer 318a is shown to have a thickness T1 in the neighboring regions 321b, and a smaller thickness T2 in the cavity region 321a. Disposed atop the dielectric layer 318a is an electrically conductive layer 318b, which may be patterned as desired to provide power to the LED. A thermally conductive layer 318c is disposed on an opposite major surface of the dielectric layer compared to layer 318b. In some cases, the layers 318b, 318c may be composed of the same material, e.g., copper, while in other cases different materials may be used. Thus, the electrically conductive layer 318b may also be thermally conductive, and the thermally conductive layer 318c may also be electrically conductive. The thermally conductive layer 318c is preferably bonded to a suitable heat sink, e.g., using a suitable thermal interface material.

The thinned region of substrate 318 is preferably associated with a corresponding thinned region of the dielectric layer 318a, which is in many cases a key structural component of the substrate. Suitable dielectric layers include polyesters, polycarbonates, liquid crystal polymers, and polyimides. Suitable polyimides include those available under the trade names KAPTON, available from DuPont; APICAL, available from Kaneka Texas corporation; SKC Kolon PI, available from SKC Kolon PI Inc.; and UPILEX and UPISEL, available from Ube Industries. Polyimides available under the trade designations UPILEX S, UPILEX SN, and UPISEL VT, all available from Ube Industries, Japan, are particularly advantageous in many applications. These polyimides are made from monomers such as biphenyl tetracarboxylic dianhydride (BPDA) and phenyl diamine (PDA).

The dielectric layer 318a may be thinned in the cavity region using any suitable method such as chemical etching, plasma etching, focused ion-beam etching, laser ablation, and punching. With regard to etching, any suitable etchant may be used, and the preferred etchant may depend on the material(s) used in the dielectric layer. Suitable etchants may include alkali metal salts, e.g. potassium hydroxide; alkali metal salts with one or both of solubilizers, e.g., amines, and alcohols, such as ethylene glycol. Suitable chemical etchants may include KOH/ethanol amine/ethylene glycol etchants such as those described in more detail in U.S. Patent Publication US 2007/0120089 (Mao et al), incorporated herein by reference. Other suitable chemical etchants may include KOH/glycine etchants such as those described in more detail in commonly assigned PCT Publ. No. WO 2012/061010, incorporated herein by reference. After etching, the dielectric layer may be treated with an alkaline KOH/potassium permanganate (PPM) solution, e.g., a solution of about 0.7 to about 1.0 wt % KOH and about 3 wt % $KMnO_4$. The dielectric layers may be clad on one or both sides with a conductive layer, e.g., layers 318b and 318c of FIG. 3. The conductive layers may be composed of any suitable electrically and/or thermally conductive materials, but typically comprise copper. If the conductive layer(s) are to be formed into circuits, they may be pre-patterned if desired. In some cases, the flexible substrate may have a multilayer construction, including multiple layers of dielectric material and conductive material in a stacked arrangement.

The type of thinning procedure used can affect the transition between the cavity region and the neighboring region, as well as the characteristics of the side walls of the dielectric layer and other layers in the transition region. Chemical etching can be used to produce relatively shallow side walls, e.g., typical side wall angles in a range from about 5 to 60 degrees measured from the plane of the flexible substrate, or from about 25 to 28 degrees. Other techniques, such as punching, plasma etching, focused ion-beam etching, and laser ablation, may produce much steeper side walls, e.g. wall angles up to about 90 degrees. In some cases, such as with punching, a hole may be formed completely through the dielectric layer. In such cases, other layers of the flexible substrate, such as conductive layers 318b and/or 318c, may be utilized to provide physical support for the LED(s) and/or phosphor layer in the cavity region.

In exemplary embodiments, the dielectric layer is significantly thinner in the cavity region 321a compared to the neighboring region 321b to increase heat conduction away from the LED(s) and/or phosphor layer and to maintain these components at cooler operating temperatures. For example, the thickness T2 may be about 5 to 25% of T1. Furthermore, T2 may be greater than zero but no more than 10 microns, while T1 may be at least 20 microns. In exemplary embodiments, T1 may be no more than 200 microns. In addition to increasing heat conduction, the thinned nature of the cavity region can provide other advantages such as the formation of slanted side walls, which may be coated with a reflecting material to provide enhanced efficiency. Also, by attaching LED(s) and/or a phosphor layer to the substrate in the thinned cavity region, these components do not extend as high above the plane of the flexible substrate, producing a lower profile device that is better suited for low form factor applications.

The reader is reminded that the remote phosphor LEDs described above, and those described elsewhere herein, are exemplary, and that remote phosphor LEDs of other designs and characteristics may also be used in the disclosed broadband light sources.

Figure 4:
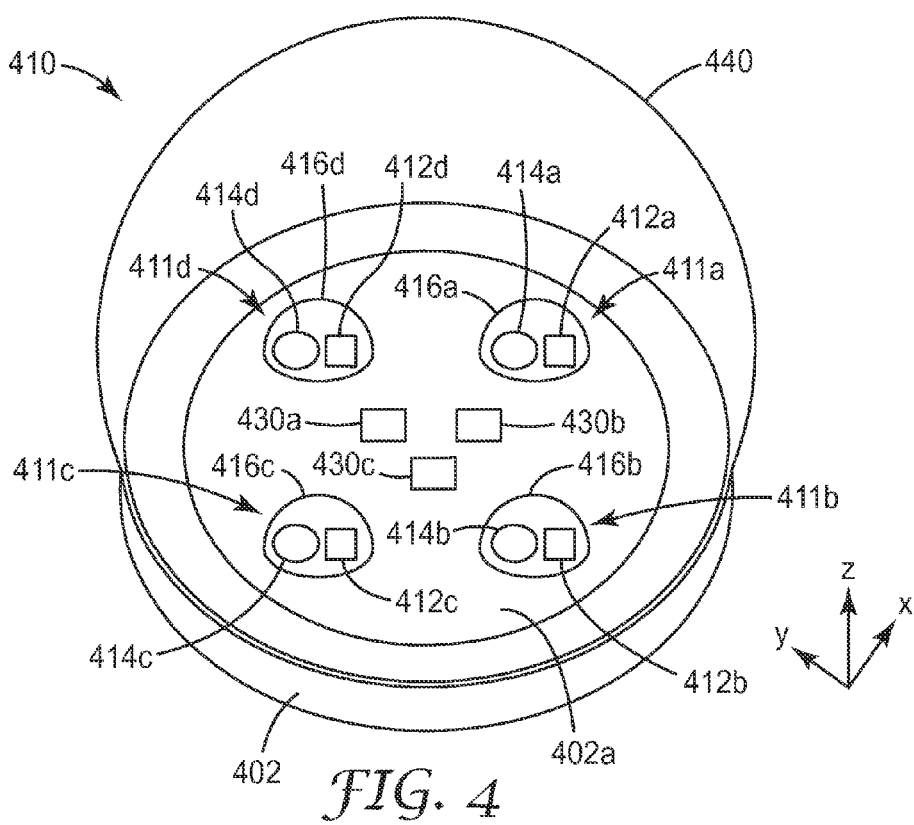
FIG. 4 is a schematic perspective view of broadband light source that combines several remote phosphor LEDs and several direct emitting LEDs.

One such broadband light source 410 is shown schematically in FIG. 4. This light source 410 combines several remote phosphor LEDs 411a, 411b, 411c, 411d, and several direct emitting LEDs 430a, 430b, 430c, of which at least one is a direct emitting short-wavelength LED, and at least one is a direct emitting long-wavelength LED. Some or all of these components may be attached directly or indirectly, through one or more intermediate layers or elements, to a supporting base 402. A light-transmissive bulb or other cover member 440 may attach to the base 402, directly or indirectly, to seal or otherwise enclose the remote phosphor LEDs and the direct emitting LEDs.

Each of the remote phosphor LEDs 411a, 411b, 411c, 411d may be the same as or similar to the remote phosphor LED 111 of FIG. 1, or to other remote phosphor LEDs disclosed herein. For simplicity, each remote phosphor LED of FIG. 4 is shown as having exactly one pump LED (see elements 412a, 412b, 412c, 412d), and exactly one phosphor layer (see elements 414a, 414b, 414c, 414d), as well as a concave dichroic reflector (see elements 416a, 416b, 416c, 416d). However, more pump LEDs, and/or more and/or differently configured phosphor layers, can also be used in one, some, or all of the remote phosphor LEDs shown in FIG. 4. Four remote phosphor LEDs are shown in the figure, but other numbers of remote phosphor LEDs may be used, including only 1, or 2, or 3, or more than 4. When more than one remote phosphor LED is used, they may be designed to be the same as or similar to each other, or they may have different designs, for example, different numbers of pump LEDs, and/or different LED types (e.g. colors or wavelengths), and/or different numbers of phosphor layers, and/or different phosphor layer thicknesses, and/or different phosphor types, and/or different dichroic reflectors, such that they individually provide different output light. The remote phosphor LEDs may be arranged symmetrically with respect to a central point or optical axis of the light source 410, or they may be arranged asymmetrically and/or irregularly.

At least one, and optionally two, of the direct emitting LEDs 430a, 430b, 430c may be the same as or similar to the direct emitting short-wavelength LED 130a of FIG. 1, and at least one, and optionally two, of the direct emitting LEDs 430a, 430b, 430c may be the same as or similar to the direct emitting long-wavelength LED 130b of FIG. 1. Three direct emitting LEDs are shown in the figure, but other numbers of direct emitting LEDs may be used, including only 2, or 4, or more than 4. When more than two direct emitting LEDs are used, any two of them may be designed to be the same as or similar to each other, or all of the direct emitting LEDs may have different designs, for example, different spectral distributions (including different spectral widths, e.g. as measured by the full width at half maximum (FWHM)), and/or different peak wavelengths or colors, and/or different output powers, such that they individually provide different output light. The direct emitting LEDs may be arranged symmetrically with respect to a central point or optical axis of the light source 410, or they may be arranged asymmetrically and/or irregularly.

The cover member 440 may be the same as or similar to the cover member 140 of FIG. 1, or to other cover members disclosed herein.

The base 402 may be the same as or similar to other bases disclosed herein. For example, the base 402 may be compatible with conventional light fixtures, and may have electrical contacts as needed and suitable circuitry to convert input electrical power to voltages and currents that are compatible with LEDs. Preferably, the base 402 includes a reflective surface 402a on which the direct emitting LEDs and the remote phosphor LEDs are mounted. Suitable reflectors include layers or coatings of aluminum, silver, or other suitable metals, and/or dielectric materials to enhance reflectivity such as multilayer organic or inorganic thin film stacks, and/or pigmented layers such as a titanium dioxide-filled resin layer. The base 402 also preferably has good thermal conductivity and heat sink properties so that the various LEDs and phosphor layers do not become excessively hot during operation of the light source 410. Excessive heat can reduce the efficiencies and lifetimes of such components. The source 410 may also include, or couple to, a control system (see FIG. 1) that is adapted to selectively energize the various LEDs in the source 410.

In the source 410, light from the various remote phosphor LEDs, and light from the various direct emitting LEDs, is transmitted by the cover member 440 and combined to provide a broadband output light for the source, as discussed for example in connection with FIG. 1. In one exemplary embodiment, the LED 430c may emit red light, e.g., having a peak wavelength in a range from 600 to 700 nm, or 600 to 650 nm, and the LEDs 430a, 430b may emit blue light, e.g. having a peak wavelength in a range from 400 to 500 nm, or 420 to 480 nm, or 445 to 500 nm, and each of the four remote phosphor LEDs may use a blue or UV pump LED and emit yellow phosphor light. If all 7 of the LEDs are fully energized (the four pump LEDs 412a, 412b, 412c, 412d, and the three direct emitting LEDs 430a, 430b, 430c), the broadband output light of the light source 410 may be substantially white. However, if the direct emitting red LED 430c is turned "off" such that only 6 of the LEDs are fully energized, the broadband output light may be a cool white color with a bluish tint. Alternatively, if the direct emitting blue LEDs 430a, 430b are turned "off" such that only 5 of the LEDs are fully energized, the broadband output light may be a warm white color with a reddish tint.

In other embodiments, multiple direct emitting LEDs of nominally the same color (e.g. blue or red) but with different peak wavelengths may be used to increase the color rendering index (CRI) and/or color quality scale (CQS) of the broadband light output of the source, as well as the luminous efficacy. For example, two direct emitting LEDs that each emit blue light but have differing peak wavelengths, and/or two direct emitting LEDs that each emit red light but have differing peak wavelengths, may be used. The difference in peak wavelength may be, for example, at least 5 or 10 nm, but less than 50 or 40 nm. For example, one direct emitting blue LED may have a peak wavelength of 445 nm, and another direct emitting blue LED may have a peak wavelength of 480 nm.

Figure 5:
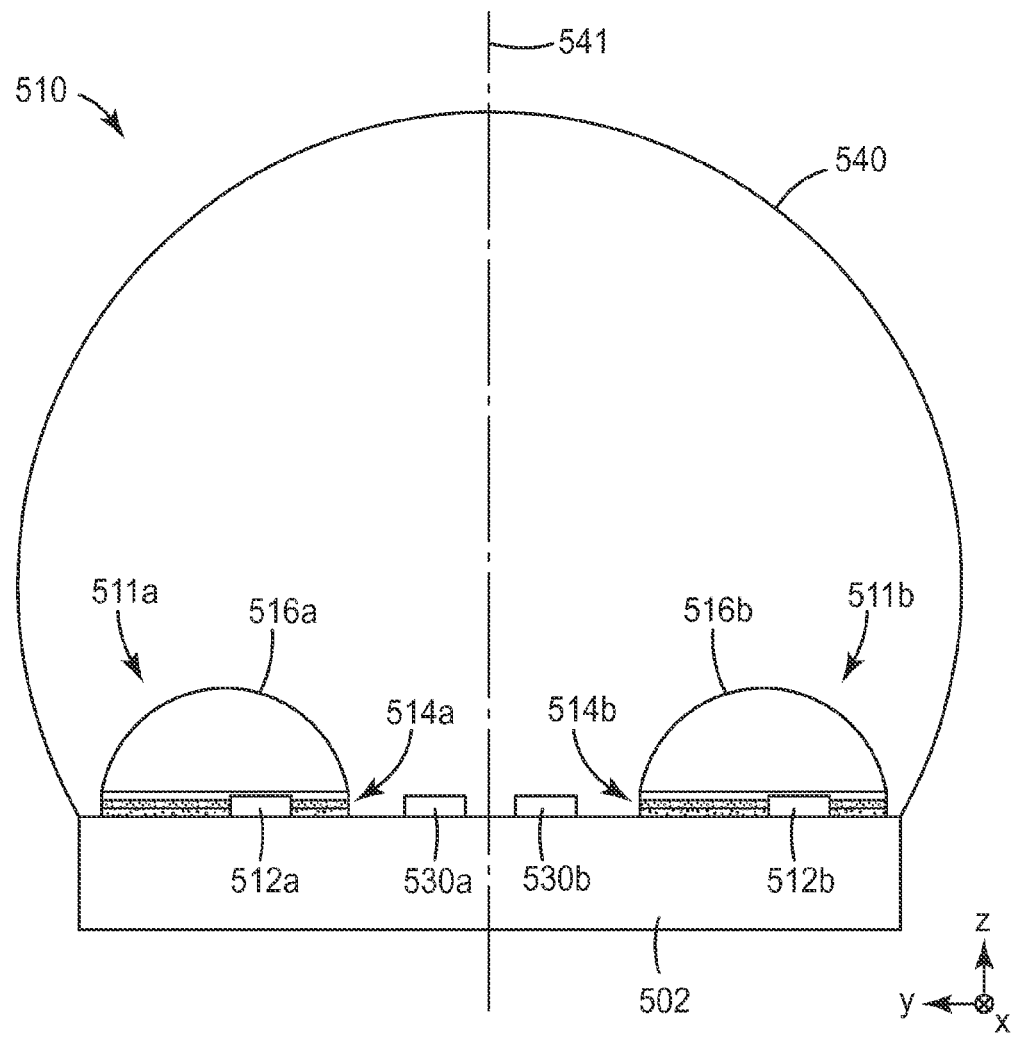
FIG. 5 is a schematic side- or cross-sectional view of another broadband light source that combines several remote phosphor LEDs and several direct emitting LEDs.

Another broadband light source 510 is shown schematically, in side- or cross-sectional view, in FIG. 5. This light source 510 combines several remote phosphor LEDs 511a, 511b, and several direct emitting LEDs 530a, 530b. Some or all of these components may be attached directly or indirectly, through one or more intermediate layers or elements, to a supporting base 502. A light-transmissive bulb or other cover member 540 may attach to the base 502, directly or indirectly, to seal or otherwise enclose the remote phosphor LEDs and the direct emitting LEDs. The source 510 is shown as having an axis of symmetry or optical axis 504.

Figure 5A:
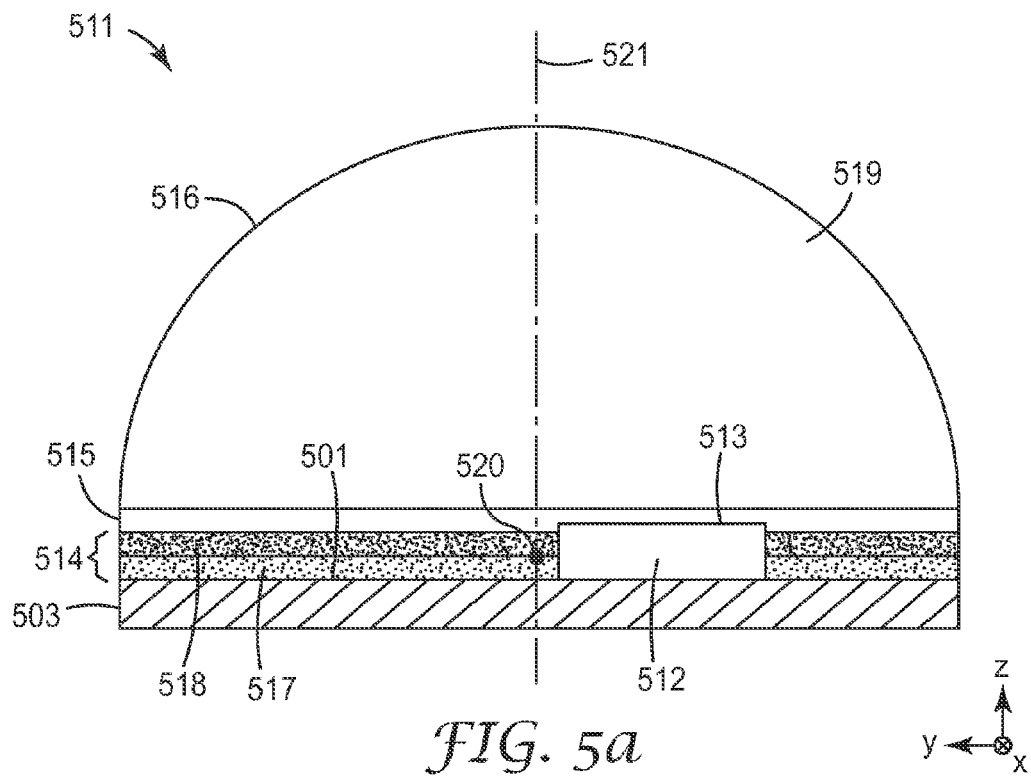
FIG. 5a is a schematic side- or cross-sectional view of a remote phosphor LED used in the light source of FIG. 5.

The remote phosphor LEDs 511a, 511b may be similar to the remote phosphor LEDs of FIG. 4, except for the phosphor layer arrangement, which is shown in greater detail in FIG. 5a. Each remote phosphor LED of FIG. 5 is shown as having exactly one pump LED (see elements 512a, 512b), and a particular phosphor layer arrangement (see elements 514a, 514b), as well as a concave dichroic reflector (see elements 516a, 516b). However, more pump LEDs, and/or more and/or differently configured phosphor layers, can also be used in one or both of the remote phosphor LEDs shown in FIG. 5. Two remote phosphor LEDs are shown in the side view of FIG. 5, but the source 510 may have 4 total remote phosphor LEDs as arranged for example in FIG. 4, or the source 510 may be modified to have other numbers of remote phosphor LEDs, such as only 1, or 3, or 5, or more. The remote phosphor LEDs 511a, 511b are shown in the side view of FIG. 5 as being positioned symmetrically with respect to a symmetry axis or optical axis 541 of the source 510. In other embodiments, the remote phosphor LEDs need not be symmetrically positioned. When more than one remote phosphor LED is used, they may be the same as or different from each other, as discussed above.

Of the direct emitting LEDs 530a, 630b, one is a short-wavelength (e.g. blue) emitting LED, and the other is a long-wavelength (e.g. red) emitting LED, as described in connection with the direct emitting LEDs 430a, 430b, 430c of FIG. 4. Two direct emitting LEDs are shown in the figure, but other numbers of direct emitting LEDs may be used, including 3, or 4, or more than 4. When more than two direct emitting LEDs are used, any two of them may be the same, or they may all be different from each other as discussed above. In the side view of FIG. 5, the LEDs 530a, 530b are shown as being positioned symmetrically with respect to the optical axis 541. In other embodiments, the direct emitting LEDs need not be symmetrically positioned.

The cover member 540 may be the same as or similar to the cover member 440 of FIG. 4, and the base 502 may be the same as or similar to the base 402 of FIG. 4.

In the source 510, light from the remote phosphor LEDs 511a, 511b, and light from the direct emitting LEDs 530a, 530b (to the extent all of the LEDs are energized by the control system), is transmitted by the cover member 540 and combined to provide a broadband output light for the source, as discussed for example in connection with FIG. 4. In an exemplary embodiment, the LED 530a emits red light, e.g., having a peak wavelength in a range from 600 to 700 nm or 600 to 650 nm, and the LED 530b emits blue light, e.g. having a peak wavelength in a range from 400 to 500 nm, or 420 to 480 nm, or 445 to 500 nm, and each of the two remote phosphor LEDs may use a blue or UV pump LED and emit yellow phosphor light. The broadband output light of the light source 510 may in that case be substantially white when all LEDs are energized.

FIG. 5a is a schematic side- or cross-sectional view of a remote phosphor LED 511 that may be the same as one or both of the remote phosphor LEDs 511a, 511b shown in FIG. 5. In FIG. 5a, the remote phosphor LED 511 has a pump LED 512, a phosphor layer 514, and a dichroic reflector 516. The dichroic reflector 516 covers the entire outer curved surface of a plano-convex lens or body 519, but in other embodiments the dichroic reflector may be made to cover only a portion of the outer curved surface. The reflector 516 is concave with respect to the LED 512 and phosphor layer 514. The dichroic reflector 516 also covers both the LED 512 and the phosphor layer 514. The body 519 has an axis of symmetry which defines an optical axis 521 of the remote phosphor LED 511. The outer curved surface of the body 519 is a section of a sphere whose center of curvature is disposed at a point 520. The pump LED 512 is situated near but spaced apart from the point 520 along the y-direction. Situated in this manner, and due to the concave shape of the reflector 516, the reflector 516 approximately images excitation light from the LED 512 onto a portion of the phosphor layer 514 on the opposite side of point 520, i.e., to the left of point 520 from the perspective of FIG. 5a.

The phosphor layer 514 is divided into two thinner phosphor layers 517, 518, which may be composed of different phosphor materials. In general, the phosphor layer may have a wide variety of configurations, and may comprise the same or different phosphor materials in distinct layers, zones, or patterned areas. In an exemplary embodiment, the upper phosphor layer 518 emits red phosphor light, and the lower phosphor layer 517 emits green phosphor light. A clear light-transmissive layer 515, which may for example be a layer of optical adhesive, separates the phosphor layer 514 (more specifically, the upper phosphor layer 518) from the planar surface of the body 519. An upper emitting major surface 513 of the pump LED 512 may be disposed within the layer 515 as shown.

The base 503 may be the same as base 502 in FIG. 5, or the base 503 may be a different support substrate used in the fabrication of the remote phosphor LED 511, which base 503 is then adhered, bonded, or otherwise attached to the base 502 of FIG. 5. The base 503 preferably has good thermal conductivity to extract heat from the LED 512 and from the phosphor layer 514. The base 503 may include electrical contacts or traces (not shown) connected to the pump LED to allow electrical control thereof. The base 503 also preferably has a reflective surface 501 that faces the phosphor layer 514 and the pump LED 512, so that excitation light and phosphor light that reach the back of the remote phosphor LED and that would be absorbed or otherwise lost can be redirected towards the front of the remote phosphor LED to boost the efficiency and light output of the remote phosphor LED 511.

Any of the disclosed broadband light sources may include a suitable control system, or they may be adapted such that they can be attached or otherwise coupled to a suitable control system. Among the various functions the control system may have, one is to control the color of the broadband output light of the light source by selectively driving or energizing the various LEDs that are included in the light source. Another function is to control the brightness of the light source. The control system is preferably capable of providing at least first and second control outputs, which correspond respectively to energizing a first group of the LEDs to provide a first output color, and energizing a second group of the LEDs to provide a second output color, the first and second output colors differing by at least 0.2 in CIE chromaticity units, and/or by at least 4000 or 5000 Kelvin in correlated color temperature. Preferably, the first and second groups of LEDs each include over half, or at least 60% or at least 70%, of the total number of LEDs. The control system may of course drive the light source according to other control outputs as well, and may transition from the first control output to the second control output, or vice versa, through one or more intermediate control outputs (including via an output that gradually and continuously varies from the first control output to the second control output, for example), or it may transition from the first control output to the second control output digitally or discontinuously, with or without intermediate control outputs. At any given time, the control system may drive any one or all of the energized LEDs in a continuous fashion or in a modulated fashion, e.g. using current or voltage pulses of variable amplitude, duration (temporal width), repetition rate, and duty cycle. Preferably, the repetition rate of any modulated LEDs is high enough so that the modulation is not perceptible by the human eye, such that the illumination from the light source is perceived by the user as substantially steady or continuous as a function of time. Transitions between different control outputs, including the two control outputs associated with the first and second output colors, may be gradual and continuous by gradually changing the duty cycle or other operating conditions of the individual LEDs that are included in the first and/or second groups of LEDs.

The control system may change the color of the light source in accordance with any desired timing scheme. For example, the control system may be programmed to change the color of the light source according to the time of day and/or time of year, and based on the locale or place (as defined for example by longitude and latitude or other global coordinates, the values of which may also be stored and/or programmed into the control system) where the light source is installed, e.g. to mimic the color characteristic of the sun or sky at that locale, or to provide another desired functional relationship between color and time of day. The control system may be programmed to change the color of the output light in a way that has a beneficial influence on the circadian rhythm of the human body, for users of the light source. In humans, too little blue light during daylight hours may have an influence on Seasonal Affect Disorder, and too much blue light at nighttime hours may have an influence on the duration and quality of sleep, for example. Therefore, the control system may be programmed to control the light source so that the first output color has a greater blue content (e.g. it may have a smaller CIE x-coordinate) than the second output color, and the second output color has a greater red content (e.g. it may have a larger CIE x-coordinate) than the first output color, and the first output color is provided during (local) daylight hours and the second output color is provided during (local) nighttime hours. The control system may control the light source based on information the control system receives from one or more devices or elements, including: a physical analog input; a touch screen, including a digital touch screen, and including movement on a touch screen; a smart phone; a computer; a tablet; a television; gesture-based recognition from human interaction, e.g. through a camera, infrared camera, or other lens-based input; a networked or wireless source; a voice or audile command; and contextual environmental conditions, such as temperature, humidity, atmospheric pressure, radiant heat, noise, aroma, ambient light (including UV), and the like, and including changes in such conditions.

The control system may be linked or coupled to the light source directly, or through one or more intermediate devices or elements, including: a selected power source; a network, including for example a closed-mesh building network; an internet protocol device; an intranet protocol device; a daisy-chain network of light sources; a wireless, networked, fiber-optic, and/or traditional or existing infrastructure.

The control system may also be configured to provide feedback to a user of the light source. The feedback may be provided, for example, on a graphical user interface such as a visual display device, which may be included as part of the control system, or which the control system may communicate with, e.g., a smart phone or self-sustaining remote control, and the feedback may also be or include an audible sound, and/or vibration. The feedback may be or include representations of, for example, the light intensity of the light source, and/or the spectrum of the light source.

The control system may also be configured such that its control of the light source is based not only on preselected settings, but also on attributes that may be selected by the user of the light source, where the user may also select how much a given attribute may influence the operation of the light source, based on a desired end result.

In some cases, the controller may be configured to modify the spectrum or color of the light source based on a reaction from the user directly. In some cases, the controller may be configured to allow the user to select a variety of inputs to develop a natural environment with the light source to achieve an organic type of living atmosphere.

EXAMPLE

A hybrid broadband light source as disclosed herein was modeled or simulated, and its output characteristics were evaluated. The simulation used LightTools™ optical design software. The example used a total of 7 (N=7) LEDs, which were made up of 4 (N1=4) pump LEDs, 2 (N2=2) direct emitting short-wavelength LEDs, and 1 (N3=1) direct emitting long-wavelength LED. The pump LEDs were configured as four separate remote phosphor LEDs. (In alternative embodiments, two or more of the pump LEDs may be combined into one remote phosphor LED, in which case the number of remote phosphor LEDs may be less than the number of pump LEDs.) The remote phosphor LEDs and direct emitting LEDs were arranged on a base, and with a bulb or cover member, as shown generally in FIGS. 4 and 5, but where the remote phosphor LEDs were of the construction shown in FIGS. 5 and 5*a*.

An output parameter of interest was the color, measured in terms of the CIE x and y color coordinates, of the broadband output light emitted by the light source. The spectral distribution (and color) of the broadband output was modeled and calculated as a function of position in a square detection plane that was 20 mm×20 mm in size and tangent to, and centered at, the apex of the concave cover member (cover member 440 in FIG. 4, cover member 540 in FIG. 5). The spatial average of the spectral distribution over the detection plane was also calculated.

Figure 6:
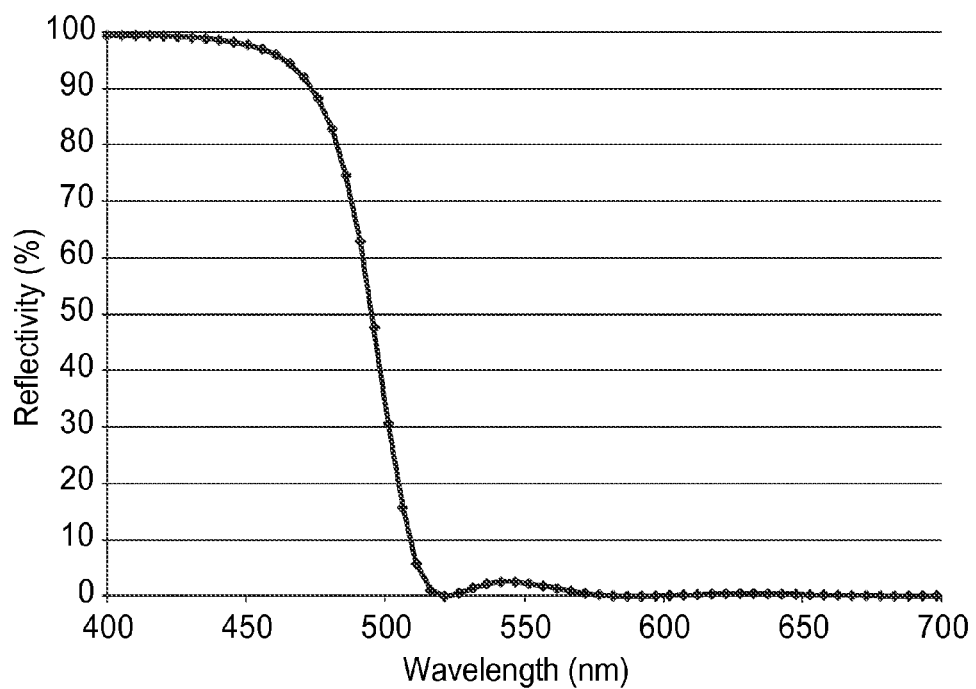
FIG. 6 is a graph of spectral reflectivity for a dichroic reflector.
Figure 7:
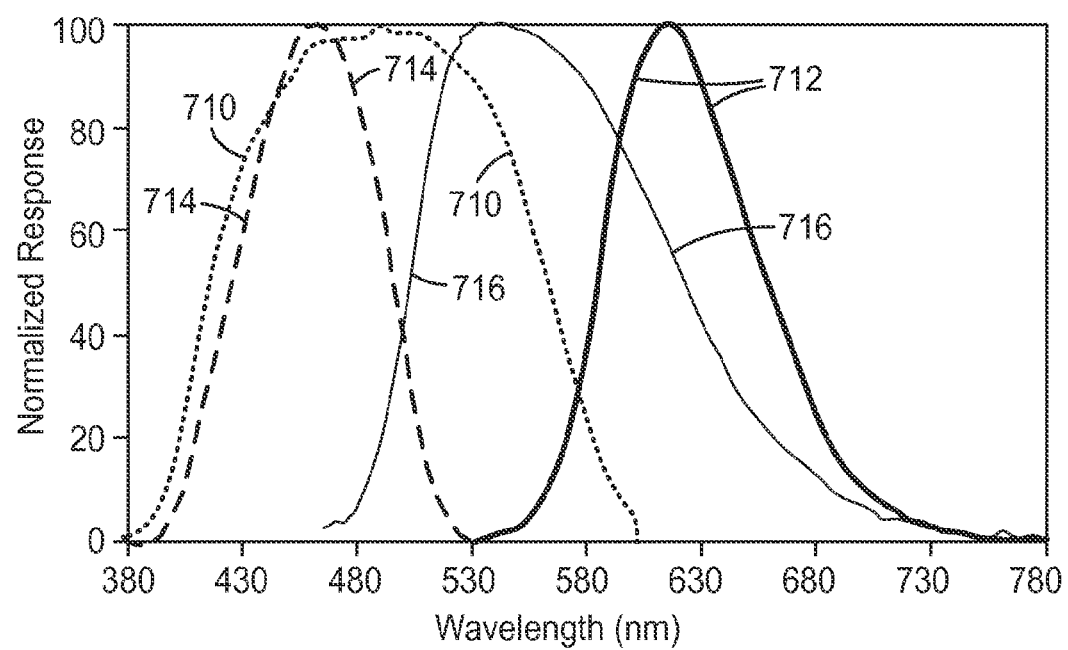
FIG. 7 is a graph of spectral properties of two phosphor materials for use in a remote phosphor LED.

Additional design features for the simulated embodiment included the following:

the three direct emitting LEDs (see 430*a*, 430*b*, 430*c* in FIG. 4, and 530*a*, 530*b* in FIG. 5) each had a square 1×1 mm emitting area, and were positioned equidistant from the center of the source (axis 541 in FIG. 5) as depicted generally in FIG. 4, the centers of each LED being 0.75 mm from the center of the source. These LEDs had a thickness of 10 microns, and a reflective coating on their back surfaces, the reflective coating having a 50% reflectivity and 50% absorption. Two of the direct emitting LEDs emitted short wavelength (substantially blue) light, and had the same individual output characteristics: peak wavelength of 460 nm, spectral bandwidth of 18.8 nm (FWHM), radiant output power of 1.0 watt. The remaining direct emitting LED emitted long wavelength (substantially red) light, and had the following output characteristics: peak wavelength of 620 nm, spectral bandwidth of 18.8 nm (FWHM), radiant output power of 1.0 watt.

the cover member was modeled as a diffusive bulb that scattered light in the forward direction with a Lambertian distribution. The cover member was hemispherical in shape, with a radius of curvature of about 10 mm and a thickness of 0.1 mm. The space within the cover member, i.e., between the cover member and the remote phosphor LEDs, was assumed to be air.

the four remote phosphor LEDs in each simulated embodiment were assumed to be identical in construction, and they were positioned symmetrically 3.5 mm from the center of the source (axis 541 in FIG. 5). Each remote phosphor LED was substantially as shown in FIG. 5a, wherein:

the plano-convex body 519 had a radius of curvature of 2 mm and a thickness of 1.8 mm, and was assumed to be made of BK7 glass;

the dichroic reflector 516 covered the entire outer curved surface of the body 519, and was a 13 layer stack of alternating SiO2/TiO2 microlayers, the stack providing a spectral reflectivity for normally incident light as shown in FIG. 6;

the layer 515 was 0.1 mm thick and had a refractive index of 1.41; the emitting surface 513 of the pump LED 512 was in the center (with regard to the z-axis) of this layer;

the pump LED 512 had a square 1×1 mm emitting area for the emitting surface 513, and a thickness of 10 microns and a back reflector like the other LEDs. The LED 512 was positioned such that a gap of 0.05 was formed (along the y-axis in FIG. 5a) between the center of curvature point 520 and the edge of the LED 512. The LED 512 had a radiant output power of 1 watt. The LED 512 had a peak wavelength of 415 nm and a spectral width (FWHM) of 19 nm.

the phosphor layers 517, 518 were each 0.1 mm thick. The upper layer 518 was assumed to emit red phosphor light, and had a normalized absorption spectrum defined by curve 710 in FIG. 7 and a normalized emission spectrum defined by curve 712 in FIG. 7. The lower layer 517 was assumed to emit green phosphor light, and had a normalized absorption spectrum defined by curve 714 in FIG. 7 and a normalized emission spectrum defined by curve 716 in FIG. 7. Each of the layers 517, 518 was assumed to be composed of phosphor particles of refractive index 1.8 immersed in a silicone binder of refractive index 1.41; the quantum efficiency of the green-emitting phosphor layer was 91%, and the quantum efficiency of the red-emitting phosphor layer was 59%; and the back surface of the lower phosphor layer 517 was assumed to be a Lambertian scatterer with 98% reflectivity.

In addition to having these simulation characteristics, the light source was assumed to be configured such that the LEDs were wired for independent electrical control, so that different groups of them could be energized as desired. The light source was then "operated" (i.e., its output was simulated) according to three different modes corresponding to three different control outputs.

Figure 8:
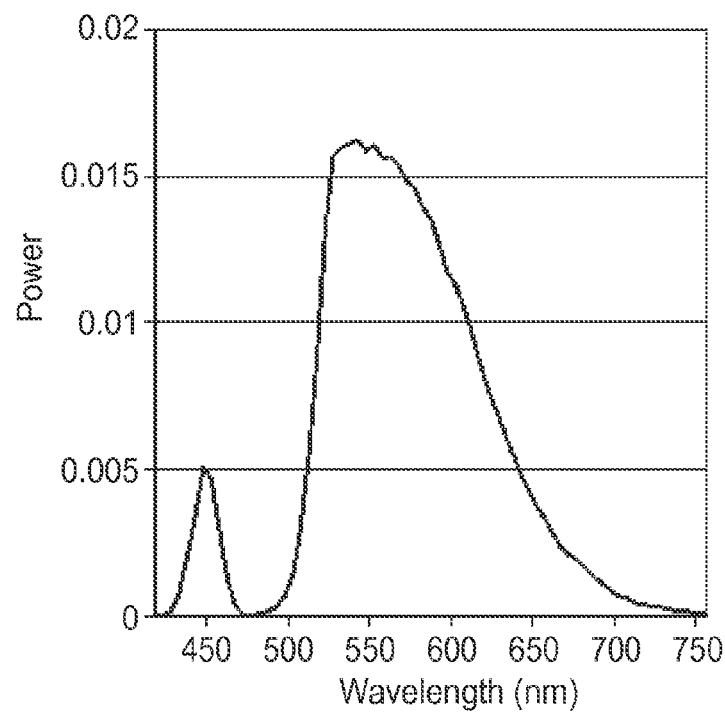
FIGS. 8, 9, and 10 are graphs of spectral power output for a simulated broadband light source when controlled according to three different control outputs, associated with three different groups of the LEDs.

In a first mode of operation, the four pump LEDs (and thus the four remote phosphor LEDs) were all fully energized, but the three direct emitting LEDs were all turned "off". Thus, four out of seven (4/7≈57%) of the LEDs were energized. In this mode, the broadband output light at the square detection plane had a yellow appearance. The spatial average of the spectral distribution over the entire detection plane was calculated, and is shown in FIG. 8.

Figure 9:
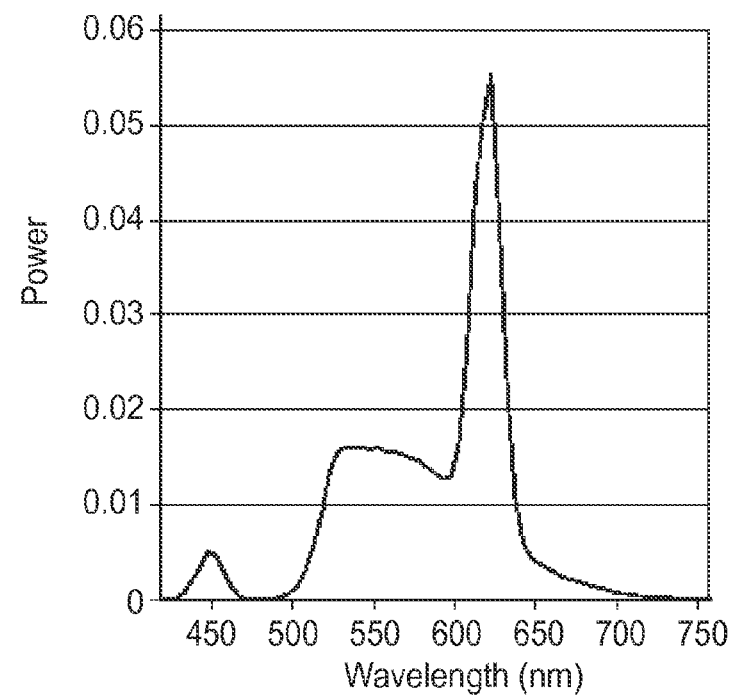
Figure 9A:
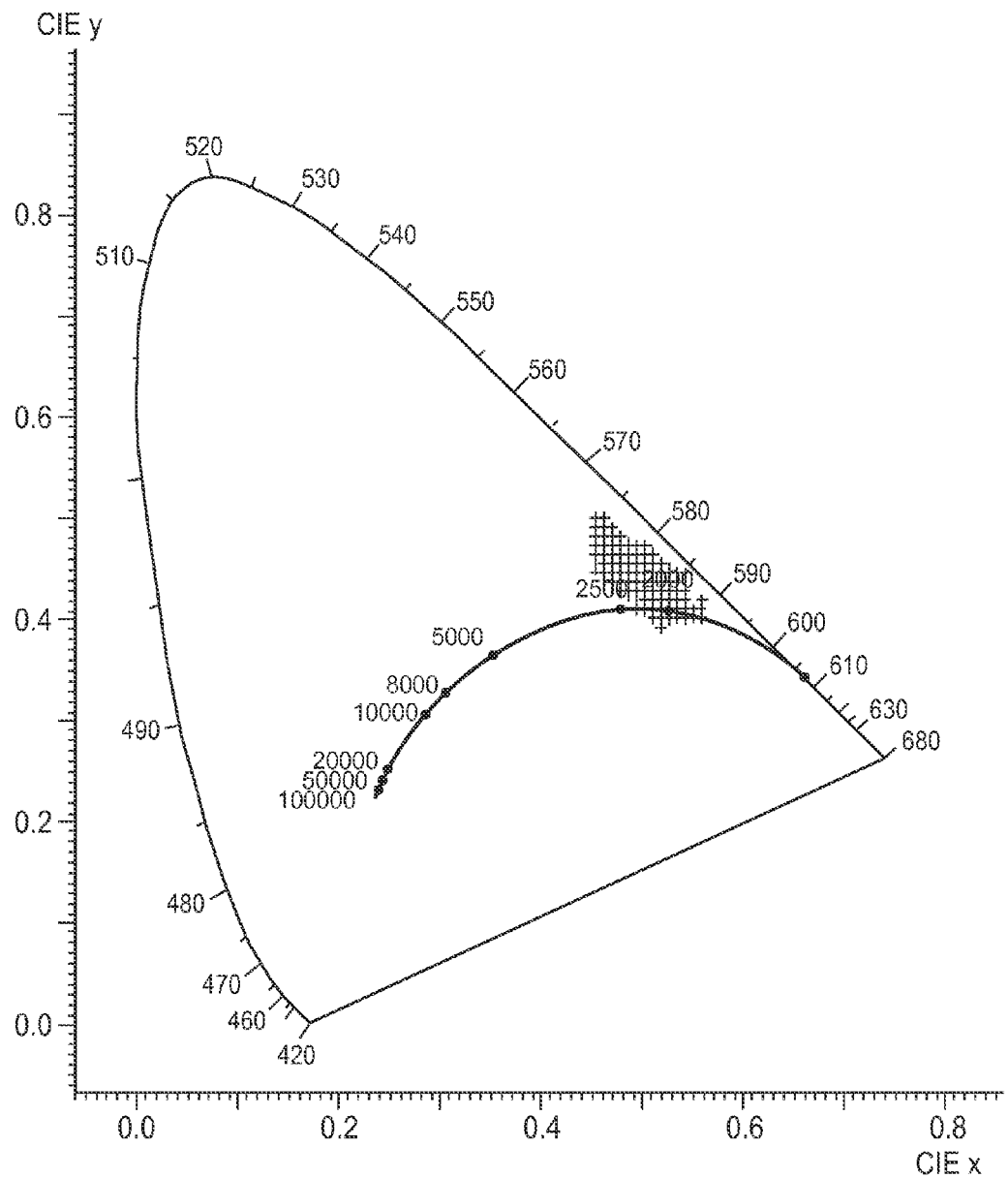
FIGS. 9a and 10a are CIE chromaticity diagrams of the colors observed at an output plane, for the simulated broadband light source of FIGS. 9 and 10 respectively.

In a second mode of operation, the four pump LEDs (and thus the four remote phosphor LEDs) were again fully energized, and the direct emitting long-wavelength LED was also fully energized, but the two direct emitting short-wavelength LEDs remained in the "off" state. Thus, five out of seven (5/7≈71%) of the LEDs were energized. In this mode, the broadband output light at the square detection plane had a warm white appearance. The spatial average of the spectral distribution over the entire detection plane was calculated, and is shown in FIG. 9. The spectral distribution of the broadband output light was also calculated at an array or grid of locations which spanned the detection plane, and the CIE color coordinates at each such location was calculated based on the spectral distribution. The resulting calculated colors are plotted on a CIE chromaticity diagram in FIG. 9a, where the calculated color at each grid location on the detection plane is plotted as a "+" symbol. The average color was sufficiently close to the Planckian locus to have a correlated color temperature, which was calculated to be 2,439 Kelvin.

Figure 10:
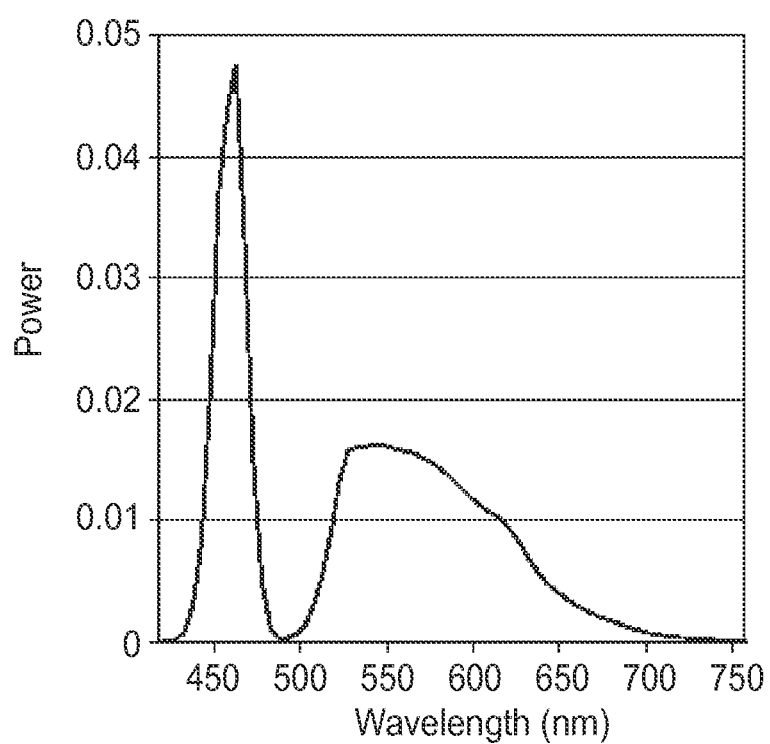
Figure 10A:
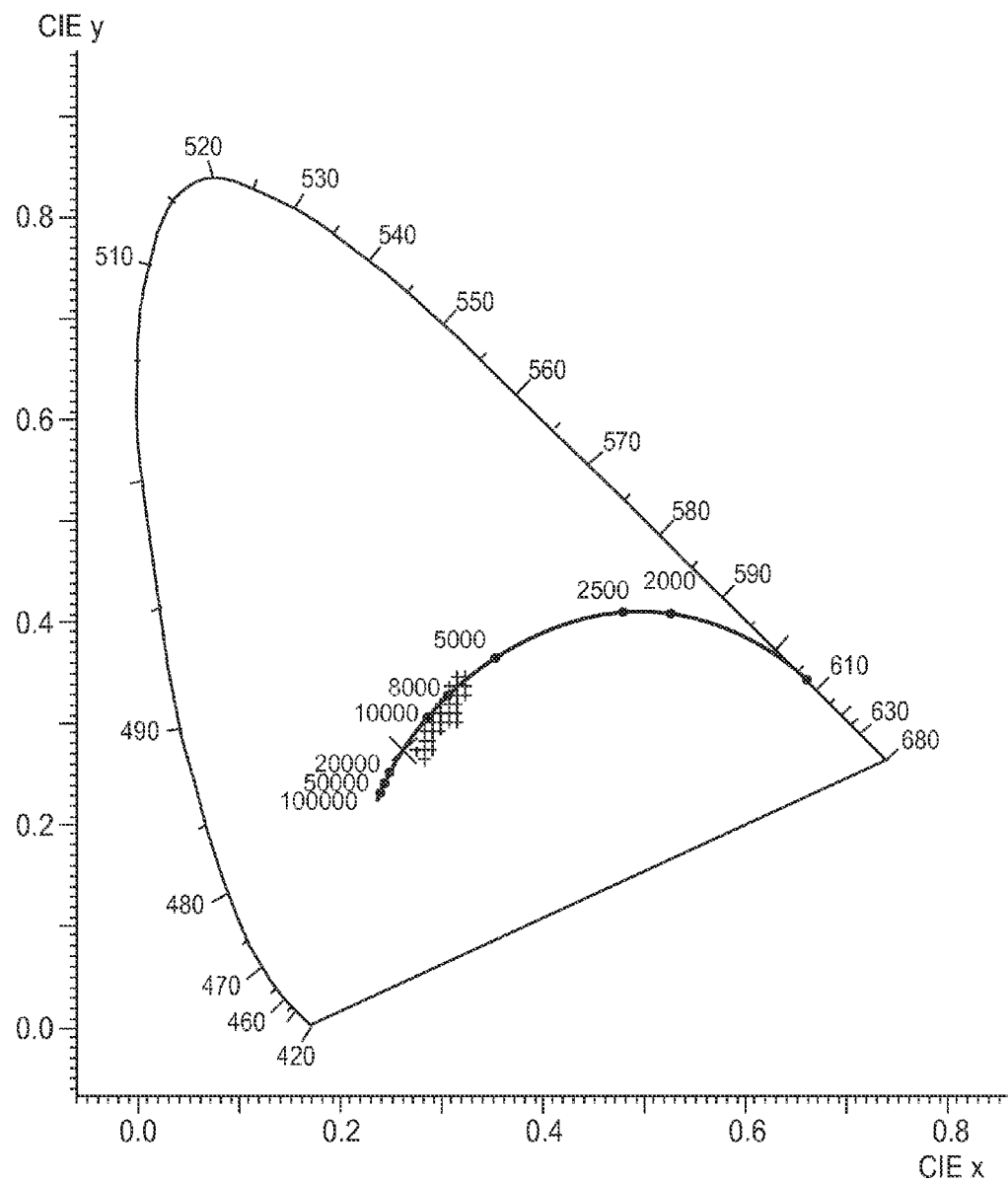

In a third mode of operation, the four pump LEDs (and thus the four remote phosphor LEDs) were again fully energized, and the two direct emitting short-wavelength LEDs were fully energized, but the direct emitting long-wavelength LED was in the "off" state. Thus, six out of seven (6/7≈86%) of the LEDs were energized. In this mode, the broadband output light at the square detection plane had a cool white appearance. The spatial average of the spectral distribution over the entire detection plane was calculated, and is shown in FIG. 10. The spectral distribution of the broadband output light was also calculated at an array or grid of locations which spanned the detection plane, and the CIE color coordinates at each such location was calculated based on the spectral distribution. The resulting calculated colors are plotted on a CIE chromaticity diagram in FIG. 10a, where the calculated color at each grid location on the detection plane is plotted as a "+" symbol. The average color was sufficiently close to the Planckian locus to have a correlated color temperature, which was calculated to be 7,563 Kelvin.

Based on the spatially averaged color of the broadband output light for the second mode of operation (having 71% LED utilization) and the third mode of operation (having 86% LED utilization), the color difference between those modes was about 0.27 in CIE chromaticity units, and about 5,124 Kelvin in correlated color temperature.

It will be apparent to the person of ordinary skill in the art that numerous changes, modifications, and adaptations can be made to the foregoing embodiments and teachings. For example, LED utilization is discussed throughout this document in terms of the "number" or "numbers" of LEDs, e.g., the total number N of LEDs, the number N1 of pump LEDs, the number N2 of direct emitting short-wavelength LEDs, and the number N3 of direct emitting long-wavelength LEDs. Such numbers N, N1, N2, and N3 may be understood to be positive integers that are obtained by simply counting the LEDs at issue. Descriptions, comparisons, and relationships that are based on such numbers are most relevant when the various LEDs being discussed have the same or similar sizes, which sizes may be expressed for example in terms of the emitting area of the LEDs. Thus, for example, if the various LEDs being discussed all have emitting areas that are the same as, or similar to, each other (a standard size for commercial LED dies at the present time is nominally 1×1 mm) then the descriptions, comparisons, and relationships discussed herein based on those numbers are of greatest relevance. If however one or more of the LEDs being discussed has or have sizes, e.g. emitting areas, that differ greatly from that of one or more other LEDs being discussed, then a more generalized approach may be taken. In the more generalized approach, the LED numbers may be replaced with "effective numbers", where the effective number is the number of the LEDs multiplied by their respective sizes (e.g. by their emitting areas), or by a factor which is proportion to their respective sizes.

For example, as an alternative to the Example described above, the four pump LEDs (each of which has a 1×1 mm emitting area) may be replaced by a single larger pump LED having the same overall emitting area (1 $mm^2$ multiplied by 4, i.e., 4 $mm^2$), while leaving the direct emitting LEDs the same size as before. The new larger pump LED may have a 2×2 mm emitting area, and may be incorporated into a single large remote phosphor LED that replaces the four original remote phosphor LEDs. In the modified light source, the number N1 of pump LEDs is 1, the number N2 of direct emitting short-wavelength LEDs is 2, the number N3 of direct emitting long-wavelength LEDs is 1, and the number N of LEDs is 4, but the size of the pump LED differs greatly from that of the direct emitting LEDs. Using these numbers, the LED utilization would be expressed as 50% (2 out of 4) for the second mode of operation (in which all LEDs except the two direct emitting short-wavelength LEDs are energized), and 75% (3 out of 4) for the third mode of operation (in which all LEDs except the one direct emitting long-wavelength LED are energized). However, if we choose a multiplicative factor proportional to the smallest emitting area of an LED in the light source, then we may describe the LED utilization in terms of effective numbers: the effective number ("NE1") of pump LEDs is 4, the effective number ("NE2") of direct emitting short-wavelength LEDs is 2, the effective number ("NE3") of direct emitting long-wavelength LEDs is 1, and the effective number ("NE") of LEDs is 7. Using these effective numbers, the LED utilization would be expressed as 71% (5 out of 7) for the second mode of operation (in which all LEDs except the two direct emitting short-wavelength LEDs are energized), and 86% (6 out of 7) for the third mode of operation (in which all LEDs except the one direct emitting long-wavelength LED are energized). From this simple alternative example, one can readily appreciate that the descriptions, comparisons, and relationships discussed herein with respect to the "number" or "numbers" of LEDs, may be generalized by consistently replacing LED numbers with LED effective numbers, as described herein.

The teachings of this application can be used in combination with the teachings of commonly assigned U.S. Patent Application Ser. No. 61/654,278 (Attorney Docket 69757US002), "Hybrid Light Bulbs Using Combinations of Remote Phosphor LEDs and Direct Emitting LEDs", filed Jun. 1, 2012.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. The reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A lighting system for emitting broad band light, comprising:
   a total number N of LEDs; and
   a light-transmissive cover member that covers the N LEDs and transmits the broad band light;
   wherein the N LEDs include:
      a number N1 of pump LEDs, each pump LED configured as a remote phosphor LED, wherein the pump LED is combined with a dichroic reflector and a phosphor layer such that at least some light from the pump LED is reflected by the dichroic reflector onto the phosphor layer to cause the phosphor layer to emit phosphor light, the dichroic reflector also configured to substantially transmit the phosphor light;
      a number N2 of direct emitting short-wavelength LEDs having peak output wavelengths in a range from 400 to 500 nm, each short-wavelength LED disposed to emit at least some light that propagates from the short wavelength LED to the cover member without being substantially reflected by any dichroic reflector; and
      a number N3 of direct emitting long-wavelength LEDs having peak output wavelengths in a range from 600 to 700 nm, each long-wavelength LED disposed to emit at least some light that propagates from the long wavelength LED to the cover member without being substantially reflected by any dichroic reflector;
   wherein the pump LEDs, the direct emitting short wavelength LEDs, and the direct emitting long wavelength LEDs are respectively wired for independent electrical control;
   wherein the broad band light transmitted by the cover member has a color that is a function of which ones of the N LEDs are energized;
   wherein the N LEDs are configured such that the broad band transmitted light can have a first color associated with a first group of the N LEDs being energized, and a second color associated with a second group of the N LEDs being energized; and
   wherein the first and second colors have a color difference of at least 0.2 in CIE chromaticity units, and wherein the first and second groups of the N LEDs each involve energizing more than half of the N LEDs.

2. The system of claim 1, wherein the first and second groups of the N LEDs each involve energizing at least 60% of the N LEDs.

3. The system of claim 1, wherein the first and second groups of the N LEDs each involve energizing all of the N1 pump LEDs.

4. The system of claim 1, wherein the first and second colors are sufficiently close to the Planckian locus such that they have respective first and second correlated color temperatures.

5. The system of claim 4, such that the first and second correlated color temperatures differ by at least 4000 Kelvin.

6. The system of claim 1, wherein N1 is at least 2, and wherein there are a plurality of remote phosphor LEDs.

7. The system of claim 6, wherein the plurality of remote phosphor LEDs utilize phosphor layers having a same phosphor composition.

8. The system of claim 6, wherein the plurality of remote phosphor LEDs utilize phosphor layers having different phosphor compositions.

9. The system of claim 1, wherein N1 >N2 +N3.

10. The system of claim 1, wherein for at least one of the remote phosphor LED(s), the pump LED, the phosphor layer, and the dichroic reflector are arranged such that at least some excitation light propagates from the pump LED to the dichroic reflector without passing through the phosphor layer.

11. The system of claim 1, wherein at least some of the pump LED(s) have a peak wavelength of less than 420 nm.

12. The system of claim 1, wherein at least some of the direct emitting short-wavelength LED(s) have a peak output wavelength in a range from 420 to 480 nm.

13. The system of claim 1, further comprising:
a control system configured to drive the N1 pump LEDs, the N2 direct emitting short-wavelength LEDs, and the N3 direct emitting long-wavelength LEDs independently.

14. The system of claim 13, wherein the control system is configured to provide first and second control outputs, the first control output being effective to energize the first group of the N LEDs to provide the first color for the transmitted broad band light, and the second control output being effective to energize the second group of the N LEDs to provide the second color for the transmitted broad band light.

15. The system of claim 1, wherein the light-transmissive cover member is light-diffusing.

16. A lighting system for emitting broad band light, comprising:
a total effective number NE of LEDs; and
a light-transmissive cover member that covers the NE LEDs and transmits the broad band light;
wherein the NE LEDs include:
an effective number NE1 of pump LEDs, each pump LED configured as a remote phosphor LED, wherein the pump LED is combined with a dichroic reflector and a phosphor layer such that at least some light from the pump LED is reflected by the dichroic reflector onto the phosphor layer to cause the phosphor layer to emit phosphor light, the dichroic reflector also configured to substantially transmit the phosphor light;
an effective number NE2 of direct emitting short-wavelength LEDs having peak output wavelengths in a range from 400 to 500 nm, each short-wavelength LED disposed to emit at least some light that propagates from the short wavelength LED to the cover member without being substantially reflected by any dichroic reflector; and
an effective number NE3 of direct emitting long-wavelength LEDs having peak output wavelengths in a range from 600 to 700 nm, each long-wavelength LED disposed to emit at least some light that propagates from the long wavelength LED to the cover member without being substantially reflected by any dichroic reflector;
wherein the pump LEDs, the direct emitting short wavelength LEDs, and the direct emitting long wavelength LEDs are respectively wired for independent electrical control;
wherein the broad band light transmitted by the cover member has a color that is a function of which ones of the NE LEDs are energized;
wherein the NE LEDs are configured such that the broad band transmitted light can have a first color associated with a first group of the NE LEDs being energized, and a second color associated with a second group of the NE LEDs being energized; and
wherein the first and second colors have a color difference of at least 0.2 in CIE chromaticity units, and wherein the first and second groups of the NE LEDs each involve energizing more than half of the NE LEDs.

17. The system of claim 16, wherein the first and second groups of the NE LEDs each involve energizing at least 60% of the NE LEDs.

18. The system of claim 16, wherein the first and second groups of the NE LEDs each involve energizing all of the NE1 pump LEDs.

19. The system of claim 16, wherein NE1 is at least 2.

20. The system of claim 16, wherein NE1 >NE2 +NE3.

* * * * *